United States Patent [19]
Bengtsson et al.

[11] Patent Number: 5,933,012
[45] Date of Patent: Aug. 3, 1999

[54] DEVICE FOR SENSING OF ELECTRIC DISCHARGES IN A TEST OBJECT

[75] Inventors: Tord Bengtsson; Lars-Gunnar Dahlberg, both of Västerås; Thomas Eriksson, Uppsala; Akbar Kheirmand, Västerås; Mats Leijon, Västerås; Henry Siberg, Västerås; Dick Rudolfsson, Västerås; Dag Winkler, Mölndal, all of Sweden

[73] Assignee: ABB Research Ltd., Zurich, Switzerland

[21] Appl. No.: 08/836,363

[22] PCT Filed: Sep. 10, 1996

[86] PCT No.: PCT/SE96/01126

§ 371 Date: May 12, 1997

§ 102(e) Date: May 12, 1997

[87] PCT Pub. No.: WO97/10515

PCT Pub. Date: Mar. 20, 1997

[30] Foreign Application Priority Data

Sep. 14, 1995 [SE] Sweden ................... 9503180

[51] Int. Cl.⁶ ............................. G01R 31/02
[52] U.S. Cl. ................. 324/524; 324/529; 324/547; 324/536
[58] Field of Search ............... 361/64, 63, 68, 361/81, 93; 340/650; 324/522, 524, 529, 509, 510, 772, 547, 536

[56] References Cited

U.S. PATENT DOCUMENTS

| | | | |
|---|---|---|---|
| 3,590,368 | 6/1971 | Esclangon | 324/522 |
| 4,234,900 | 11/1980 | Miyazaki | 324/509 |
| 4,540,939 | 9/1985 | Osborne | 324/522 |
| 4,833,414 | 5/1989 | Heller | 324/509 |
| 5,072,403 | 12/1991 | Johns | 324/522 |
| 5,586,043 | 12/1996 | Breen | 324/522 |

FOREIGN PATENT DOCUMENTS 0 061 254  10/1985  European Pat. Off. .
37 08 731   6/1988  Germany .

OTHER PUBLICATIONS

Patent Abstracts of Japan, vol. 17, No. 302, p–153, Abstract of JP–5–26949, Feb. 5, 1993.
Patent Abstracts of Japan, vol. 16, No. 586, p–1463, Abstract of JP–4–235360 Aug. 24, 1992.
Patent Abstracts of Japan, vol. 6, No. 53, p–109, Abstract of JP–56–168172 Dec. 24, 1981.
Patent Abstracts of Japan, vol. 18, No. 194, p–1722, Abstract of JP–6–3404 Jan. 11, 1994.
Patent Abstracts of Japan, vol. 5, No. 150, p–81, Abstract of JP–56–82464 Jul. 6, 1981.

*Primary Examiner*—Josie A. Ballato
*Assistant Examiner*—Jose M. Solis
*Attorney, Agent, or Firm*—Pollock, Vande Sande & Amernick

[57] ABSTRACT

A device for sensing electric discharges in a test object with at least two electric connection conductors comprises transducer equipment and evaluation equipment. The transducer equipment comprises at least one transducer for direction-sensitive sensing of current pulses through the connection conductors by sensing a magnetic field, generated by the current pulses, and the polarity thereof. The transducer delivers a transducer signal to the evaluation equipment in dependence on said current pulses and their direction. The evaluation equipment generates, in dependence on received transducer signals, an indicated signal indicating an electric discharge in the test object.

21 Claims, 28 Drawing Sheets

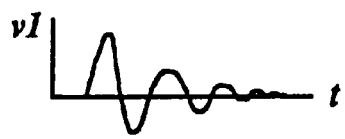
Fig. 2B1
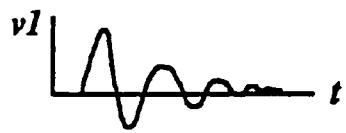
Fig. 2C1
Fig. 2B2
Fig. 2C2
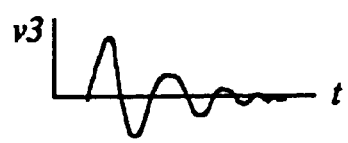
Fig. 2B3
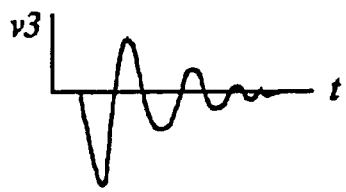
Fig. 2C3
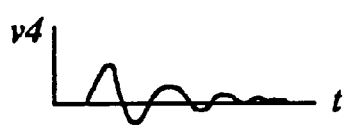
Fig. 2B4
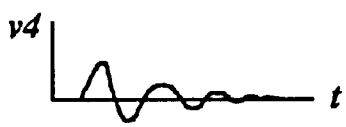
Fig. 2C4
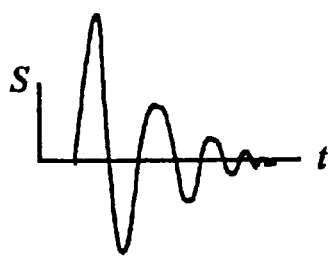
Fig. 2B5
Fig. 2C5

Fig. 3C1
Fig. 3D1
Fig. 3C2
Fig. 3D2
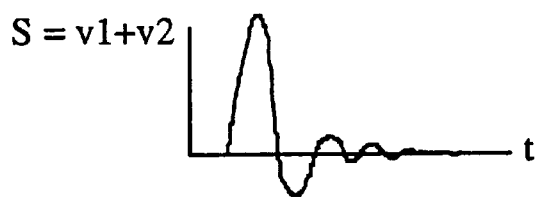
Fig. 3C3
Fig. 3D3
Fig. 3C4
Fig. 3D4

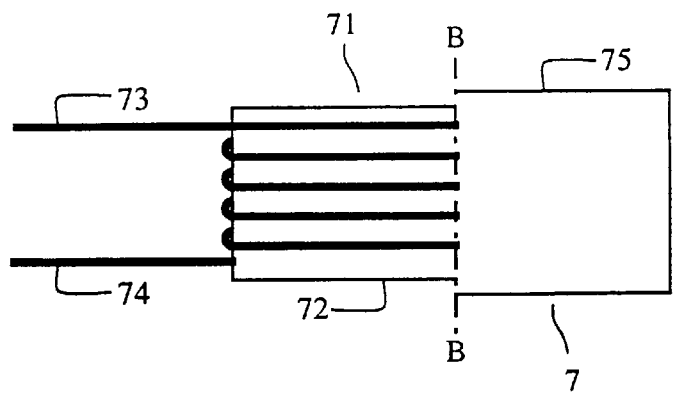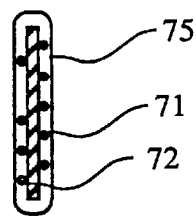
Fig. 6A  Fig. 6B
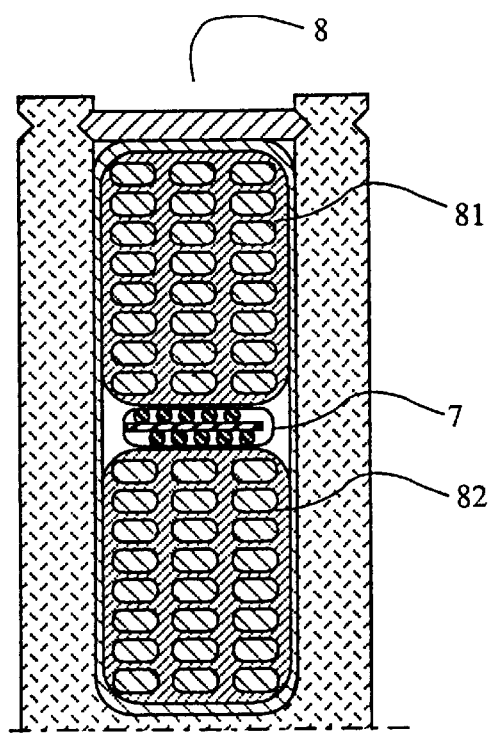
Fig. 6C
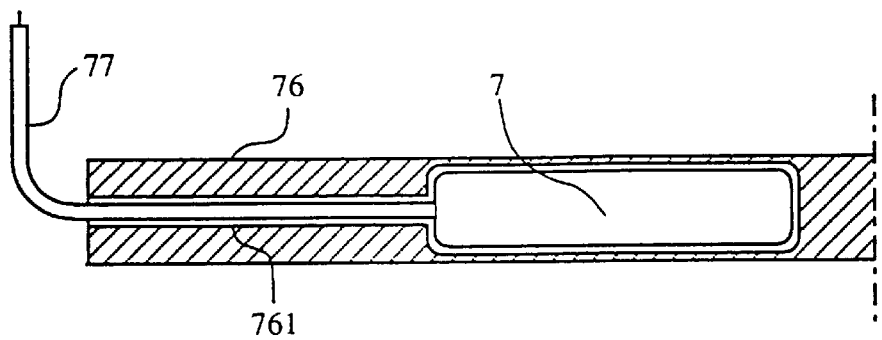
Fig. 6D

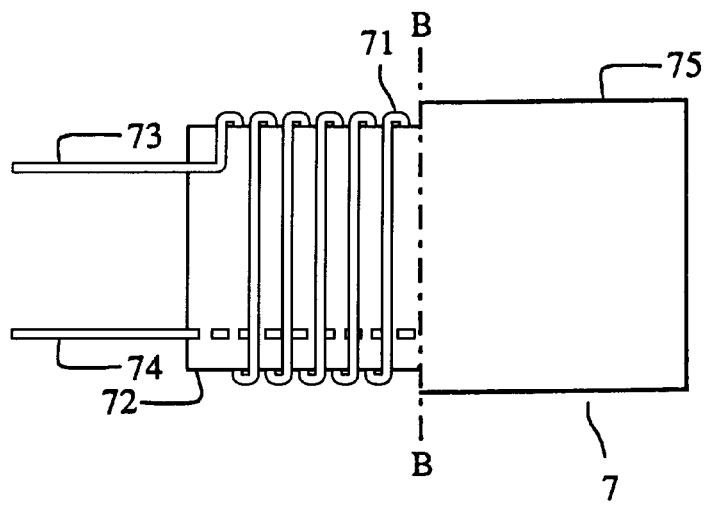
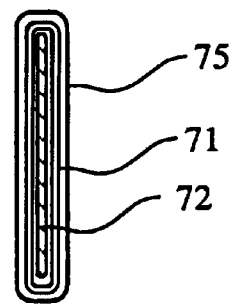
Fig. 7A    Fig. 7B
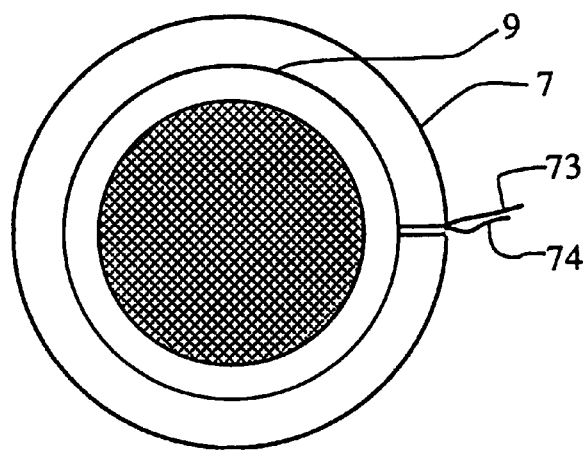
Fig. 7C

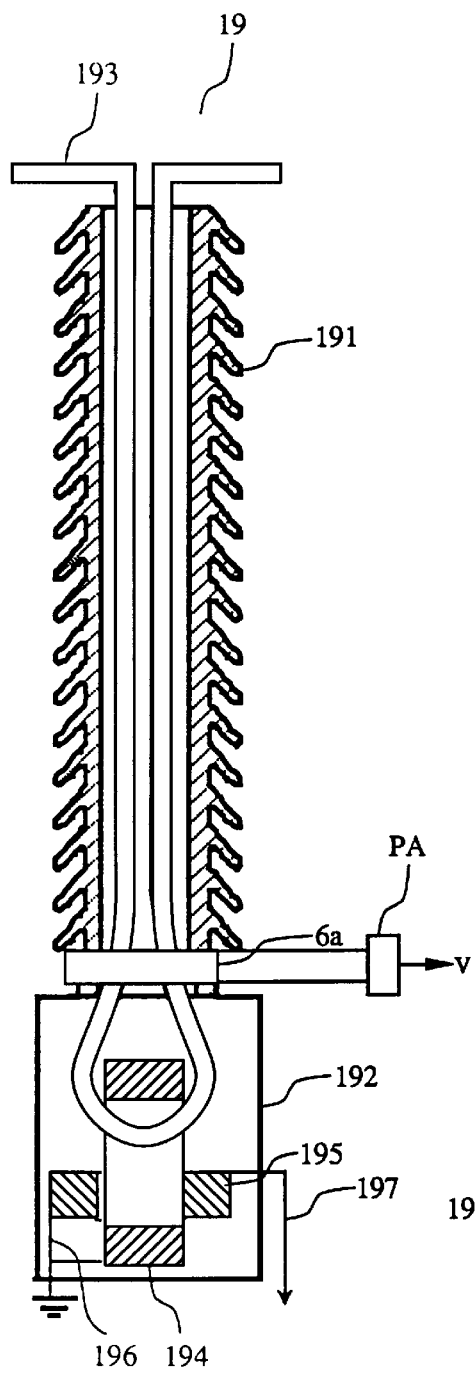
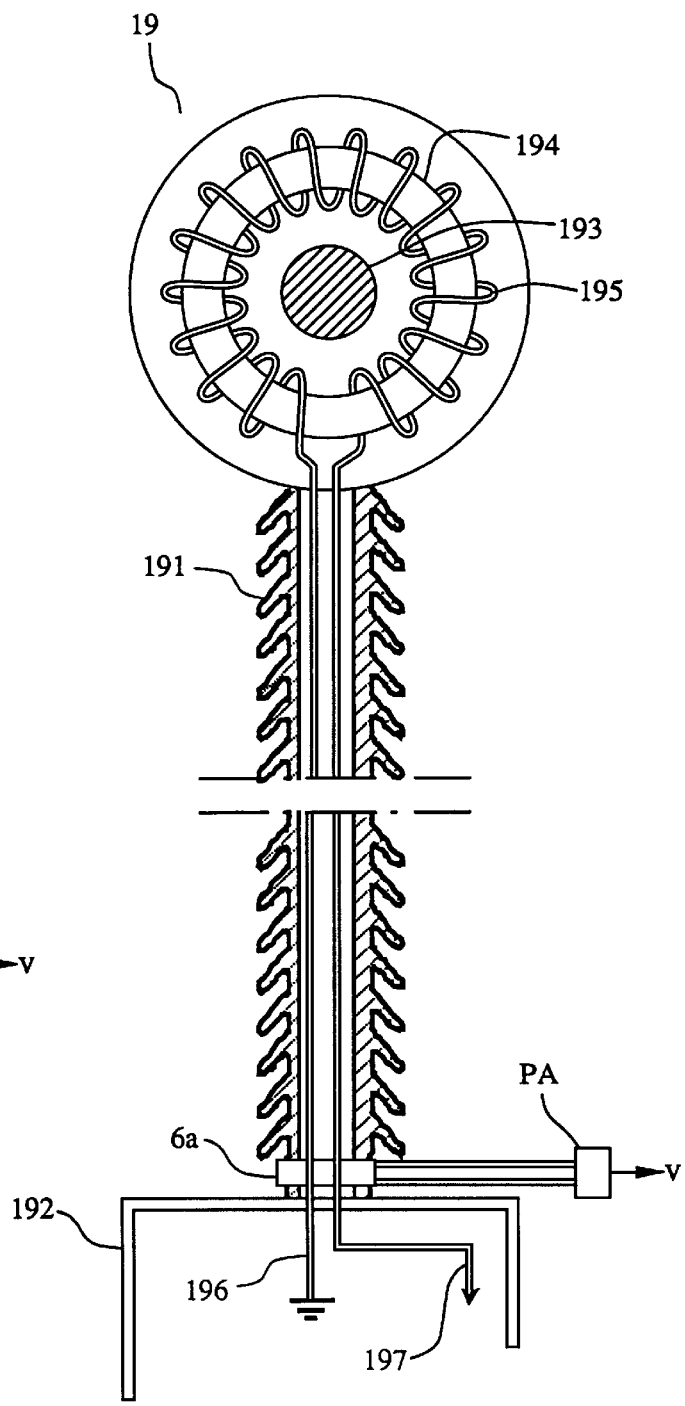
Fig. 24A
Fig. 24B

DEVICE FOR SENSING OF ELECTRIC DISCHARGES IN A TEST OBJECT

TECHNICAL FIELD

The present invention relates to a device for sensing of electric discharges in an object to be tested (hereinafter referred to as a "test object").

BACKGROUND OF THE INVENTION

The presence of local electric discharges, so-called partial discharges, in the insulation system for electric installation components (hereinafter referred to as "components" only) or electric high-voltage apparatus, such as, for example, instrument transformers, switching devices, generators, power transformers, cables, etc., constitutes an important parameter when assessing the quality, condition, and expected service life of the component. Therefore, the acceptance tests of components for an electric high-voltage installation normally comprise a testing with respect to the occurrence of partial discharges under well defined conditions, for example according to IEC Publ. 270 "Partial Discharge Measurements". In addition to this, different methods and devices have been developed for testing at the site of the installation for the purpose of estimating, after some time in operation, the condition of components and hence, for example, creating a more reliable basis for decision on preventive maintenance. For power generators, for example, measurement equipment is also available which allows a continuous monitoring during operation.

In installations and/or components which comprise several electric circuits, it is also important, in addition to being able to distinguish partial discharges from external noise, to be able to locate a detected partial discharge to a definite electric circuit, for example a certain generator coil in a power generator.

A partial discharge in a component gives rise to current pulses through the conductors by which the component is connected to the surroundings and these current pulses can be sensed either by measuring the voltage caused by the current pulses when passing through a measuring impedance connected to one of the conductors, or by a direct or indirect current measurement. During voltage measurement, the measurement equipment comprises a coupling capacitor, which must be free from partial discharges under the conditions wherein the measurement is carried out, and the test object, the coupling capacitor and the measuring impedance are galvanically interconnected, in a known manner, and connected to the surrounding components and testing equipment, respectively.

One problem when measuring partial discharges is to distinguish measurement signals emanating from partial discharges in the test object from disturbances emanating from partial discharges in the surrounding components or in the testing equipment or which have another origin but a frequency and amplitude spectrum resembling the spectrum of the partial discharges. Such disturbances may be passed to the test object through the conductors by which they are galvanically connected to the surroundings but may also, in the frequency ranges used, be captured by the measurement device by electromagnetic radiation from the surroundings.

During testing in a test room environment, the noise level may be reduced by screening the test room and filtering the voltage supply, but this is normally not possible when testing at an installation site. Disturbances of the kind mentioned may also be suppressed by so-called balanced test circuits where the component to be tested is balanced against a reference impedance, in which case disturbances occur as cophasal signals across measuring impedances series-connected to the test object and to the reference impedance. The reference impedance may comprise a component similar to the test object or of an impedance imitating this, usually a reference capacitor, which is then to be free from partial discharges during the testing. The balanced test circuits may also be designed as complete bridge connections. The above-mentioned coupling capacitors and the reference impedances and measuring impedances, respectively, must be galvanically connected to the component during testing and also to the high-voltage source to which the test object is connected.

Voltage measurement across a measuring impedance has the fundamental disadvantage that the measurement sensitivity decreases with increasing capacitance of the test object.

When sensing the partial discharge by current measurement, only one sensor is required, which is sensitive to the magnetic field associated with the current pulse. The measurement signal obtained from such sensors may thus be kept galvanically separated from the test object and the high-voltage circuit connected to the test object, thus eliminating problems such as the influence from loops in the ground circuits. Current-measuring sensors eliminate the need for coupling capacitors and measuring impedances and can be designed with very small dimensions, which makes it simple to arrange them at components of varying dimensions and shapes.

German patent DE 37 08 731 describes an electric switching device for detecting interference pulses, particularly in partial discharges, in a high-voltage installation. Between a live part of the installation and ground potential, a voltage divider of a capacitive nature is connected. The voltage from the medium voltage terminal thereof is supplied, via impedance networks adapted for the purpose, to a circuit for evaluating partial discharges. Such a device cannot usually distinguish pulses emanating from partial discharges in the component from interference pulses originating from outside the component in question, and the device shown in such patent document suggests a method of dealing with this problem. A current transformer is connected with its primary winding to a conductor which, at high-voltage level, connects the component to the surroundings, and its secondary winding is divided into two parts by means of a center tap, each part being loaded by a resistance.

The secondary winding is wound in such a way that the voltages between the center tap and the respective terminal are equal in magnitude but of opposite phase position. The medium-voltage terminals of the voltage divider are connected to the center tap on the secondary winding of the current transformer so that the voltage at the respective terminal of the secondary winding consists of the vectoral sum of the voltage from the voltage divider and the voltage across the corresponding part of the secondary winding. Depending on the current direction through the primary winding of the current transformer, different magnitudes of these voltages are thus obtained. A partial discharge within the component gives rise to a current pulse through the primary winding of the current transformer in a direction away from the component towards its surroundings whereas an externally arriving interference pulse gives rise to an interference pulse through the primary winding of the current transformer in the opposite direction. By evaluating the voltages sensed at the terminals of the secondary winding, it can thus be determined whether a detected pulse emanates from a partial discharge in the component in question.

The current transformer may advantageously be designed as a bifilarly wound Rogowski coil. In components with a plurality of voltage terminals, a more accurate location of a partial discharge may be achieved by arranging the switching device at more than one voltage terminal. The measurement principle is thus based on a voltage proportional to the voltage across the component being available and therefore comprises, in addition to a device for direction-dependent current sensing, also a voltage divider of a high-pass character. In the event that such a voltage divider cannot be galvanically connected at the component in question, the use of a field probe or an aerial for capacitive sensing of the voltage on the component is proposed.

European patent EP 0 061 254 B describes a device for monitoring of partial discharges in high-voltage equipment comprising more than two components and exhibiting more than two discharge paths for a partial discharge, for example a transformer substation, in which case it should be possible to individually, and continuously, monitor each selected component and to distinguish partial discharges from noise and signals emanating from externally arriving voltage transients.

The described device is designed for monitoring a number of components in the form of high-voltage devices, connected between a common high-voltage busbar and ground potential or a low-voltage conductor. At their connection to ground potential and to the low-voltage divider, respectively, the components to be monitored have a discharge detection unit inductively connected to the connection by means of a high-frequency current transformer. A partial discharge in a component gives rise to a current pulse through the current transformer belonging to the component but, since the components, the high-voltage busbar and ground potential and the low-voltage divider, respectively, form a network for the partial discharge paths, also through the other current transformers, but with reversed polarity therein. A voltage transient or other disturbance on the high-voltage busbar, on the other hand, gives rise to current pulses of the same polarity through all the current transformers. Each of the discharge detectors delivers a coded signal, the pulse width of which corresponds to the polarity of the detected current pulse, to a decoder. The decoder comprises a number of demultiplexers, which generate and store a signal pattern corresponding to the detected state of polarities for each of the components. This signal pattern is decoded and evaluated, whereby a deviating polarity of a detected current pulse from one component indicates a partial discharge therein.

The device requires an extensive electronic system for coding and evaluation, comprising monostable multivibrators, memory and decoding circuits, and the system in its entirety is necessarily given a large physical extension. A pulse emanating from a partial discharge in a component is damped during its propagation along the busbar and through the other components, which may result in not all the discharge detection units delivering a signal to the demultiplexers. The device described above will thus not function as intended and a special electronic circuit has been introduced to indicate and signal this state. It is also conceivable that more than one of the discharge detection units deliver a signal with a polarity deviating from that of the remainder, which may be due to correctly or incorrectly detected partial discharged. Also this results in the device not functioning in the intended way and also this state is sensed and signalled by means of a special electronic circuit.

SUMMARY OF THE INVENTION

The object of the invention is to provide a device of the kind stated in the introduction, which, by means of transducers which can be applied in a simple manner to components of a varying size and shape also during continuous monitoring under regular operating conditions, allows a simple and reliable distinction between, on the one hand, partial discharges in a predetermined component and, on the other hand, external interference and partial discharges in connected components or test equipment. In this way, a safe and reliable location of a possible partial discharge to the predetermined component can be carried out.

Advantageous improvements of the invention will become clear from the following description and claims.

BRIEF DESCRIPTION OF THE DRAWINGS

The invention will be explained in more detail by description of embodiments with reference to the accompanying drawings, wherein FIGS. 2B–2C show sensor signals in a device according to FIG. 2A during a discharge in, and outside, the test object, respectively, FIGS. 6A–6D show embodiments of a sensor in a device according to the invention, FIGS. 7A–7C show further embodiments of a sensor in a device according to the invention.

DETAILED DESCRIPTION OF THE PREFERRED EMBODIMENTS

Figure 1:
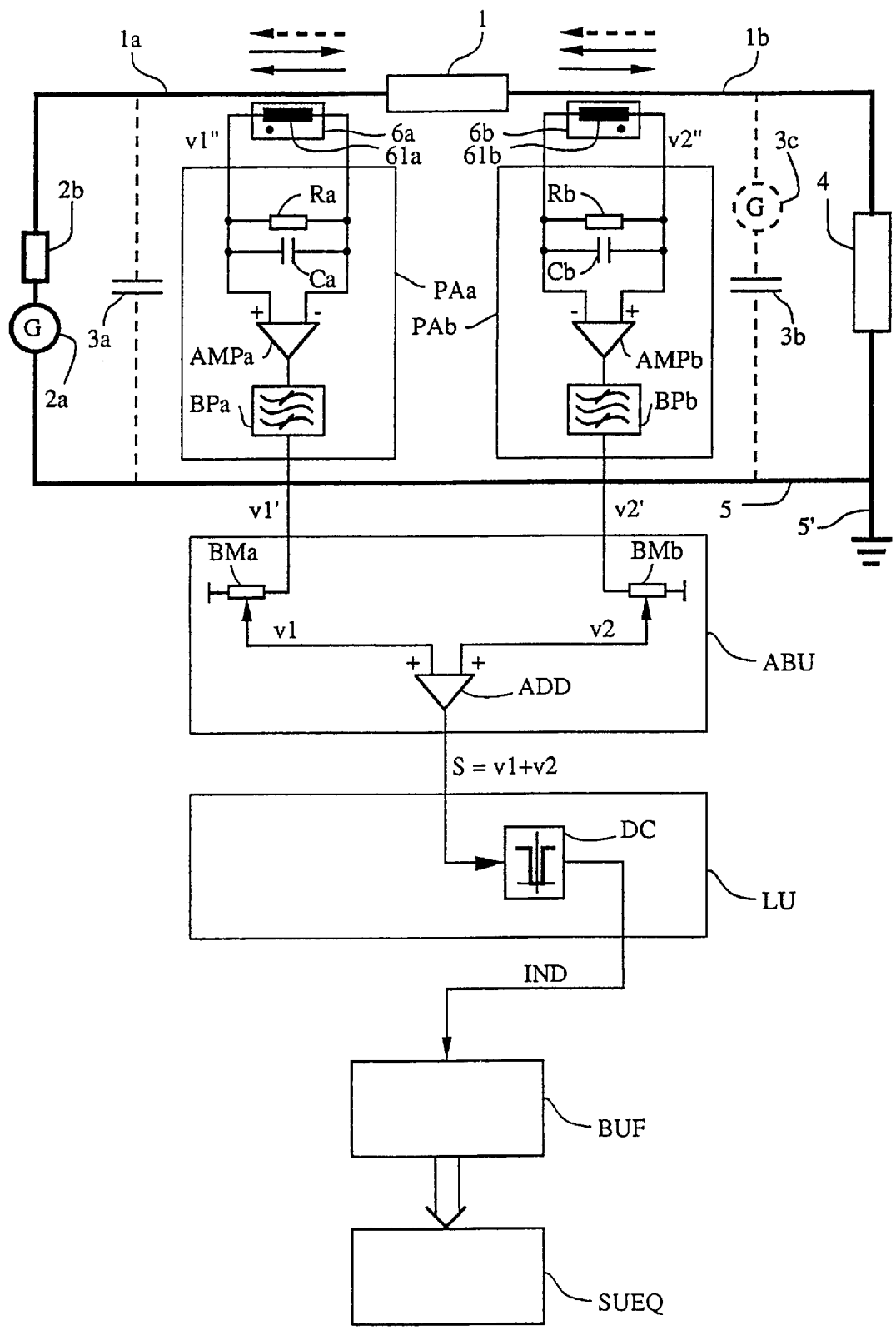
FIG. 1 shows a device according to the invention in a test object with two connection conductors and one sensing device at each of these.

FIG. 1 shows a test object 1 with two electric connection conductors 1a and 1b. The test object comprises of an electric component which is insulated against its surroundings, or of an electric high-voltage apparatus, such as, for example, a cable, a power transformer, a switchgear cubicle, or a high-voltage generator, but is shown generally in the figure as an impedance element.

The test object is energized by power frequency, that is, usually 50 Hz or 60 Hz, which is marked in the figure by a generator 2a, connected to the test object via an external impedance element 2b, which impedance element usually comprises an inductive element, in a series-connection with the generator. Across the test objects there are stray capacitances and interference voltages, marked in the figure by capacitive elements 3a, 3b and an interference voltage generator 3c. Additional components, marked by 4 in the figure, are connected to the generator 2a by way of a conductor 5 and to the test object 1 by way of the conductor 1b. The conductor 5 is connected to ground by way of a ground conductor 5'.

An electric discharge in the insulation system of the component, that is, a partial discharge, gives rise to a current pulse which, by current splitting, is distributed through the connection conductors of the component to the circuit in which the component is included. If such a discharge of a certain polarity occurs in the component 4, the current pulse through the connection conductors of the test object will have the direction marked by dashed arrows in the figure, that is, the current pulse passes into the test object through the connection conductor 1b and passes out of this through the connection conductor 1a.

If, on the other hand, such a discharge occurs in the test object, the current pulses through the connection conductors of the test object will have the direction which is marked by unbroken arrows in the figure, that is, the discharge generates current pulses which essentially simultaneously flow through the two connection conductors, either in a direction out from the test object, or in a direction into this. Whether the current direction is out from, or into, the test object is dependent on the polarity of the discharge. By "essentially simultaneously" is meant in this context that the current pulses in the two connection conductors have their common origin in one and the same discharge in the test object. It is to be understood, however, that since at least certain kinds of test objects exhibit an impedance which, in the frequency range used for sensing of current pulses, damps the amplitude of and/or phase-shifts currents which pass through the test object through their connection conductors, generally no absolute simultaneousness occurs. If, for example, discharges occur in the component 4, current pulses through the connection conductor 1a, because of deviation and phase shift in the test object, will occur delayed in phase and damped in relation to current pulses through the connection conductor 1b.

Sensor equipment comprises a sensor 6a arranged at the connection conductor 1a and a sensor 6b arranged at the connection conductor 1b. The sensors sense the magnetic field which is generated by the current pulses through the connection conductors and are direction-sensitive with respect to the polarity of the magnetic field. Each of the sensors delivers a sensor signal v1" and v2", respectively, when a current pulse flows through the respective connection conductor, whereby the polarity of the sensor signal is dependent on the polarity of the magnetic field and hence on the direction of the current pulse. In this embodiment, the sensors comprise Rogowski coils 61a and 61b, respectively, which surround the respective connection conductor. However, for the sake of clarity, the coils are shown in the figure as elongated coils along the respective connection conductor.

In this connection, a Rogowski coil means a coil arranged in such a way in an electric conductor that the axis of the coil is directed at least substantially in the same direction as the field lines in the magnetic field that an electric current in the conductor generates around the conductor.

The coils are arranged such that voltages of the same polarity are generated at the terminals on the coils which are marked in the figure by a point, when current pulses flow through the connection conductors in a direction so as to pass through the coils from that end of the coils marked by a point to the unmarked end.

The sensor can also be based on other principles, known which give a direction-sensitive sensing of the magnetic field generated by the current pulses, for example comprising Hall elements, magnetoresistive elements, or superconducting elements, so-called SQUIDs.

Each of the sensor signals is supplied to evaluation equipment comprising a filter unit PA, associated with the respective sensor, a signal-mixing unit ABU and a logic unit LU.

Each of the filter units comprises resistive and capacitive impedance elements R, C for tuning the sensor to a resonance frequency which is within the frequency range of interest to the sensing, which typically is in the range 0.1–1 MHz. Further, each of the filter units comprises an amplifier AMP and a bandpass filter BP, the bandpass of which lies within the frequency range of interest to the sensing. The filter units PA, the resistive and capacitive impedance elements R, C, the amplifiers, and the bandpass filters are in the figure marked PAa, PAb, Ra, Ca, Rb, Cb, AMPa, AMPb and BPa, BPb, respectively. The output signals from the bandpass filters are designated v1' and v2', respectively.

The signal-mixing unit ABU comprises an adding member ADD, which is supplied with the output signals v1' and v2' from the bandpass filters via respective weighting members BM, schematically marked in the figure as potentiometers BMa and BMb, respectively. The output signals v1 and v2, respectively, from the weighting members, that is, from the movable terminals of the potentiometers, are supplied to the adding member, the output signal S of which constitutes a sum signal formed as the sum of the signals v1 and v2.

The sum signal S is supplied to a discriminator DC which is comprised in the logic unit and which delivers an indicating signal IND when its input signal in magnitude exceeds a preselected comparison value.

The device described with reference to FIG. 1 operates as follows. When a discharge occurs outside the test object, for example in the component 4, the output signals v1' and v2' from the bandpass filters will be of different polarity, since the current pulse associated with the discharge passes the sensor 6b in a direction from that end of the coil marked by a point, to the unmarked end of the coil, but passes the sensor 6a in a direction away from the unmarked end of the coil to that end which is marked by a point. For example, by sensing of an interference pulse externally applied in some known manner, the weighting members may be adjusted such that the output signals v1 and v2 from them will have the same amplitude. This means that the sum signal S under these circumstances will deviate insignificantly from zero, and therefore the discriminator DC, with a suitably selected comparison value, will not deliver any indicating signal.

If a discharge occurs in the test object, the output signals v1' and v2' from the bandpass filters will be of the same polarity, since the current pulses associated with the discharge pass both sensors either in a direction from that end of the coil marked by a point to the unmarked end or in the reverse direction. Under these conditions, the sum signal S will deviate from zero, and therefore the discriminator DC, with a suitably selected comparison value, will deliver an indicating signal.

The indicating signal is forwarded to monitoring equipment SUEQ, in some known manner, possibly via a signal interface unit BUF.

In particular in test objects with an inductive impedance and exhibiting a high capacitance to ground, it is advantageous to choose the passband of the bandpass filters such that the natural resonance frequency of the test object falls outside the passband thereof.

Figure 2A:
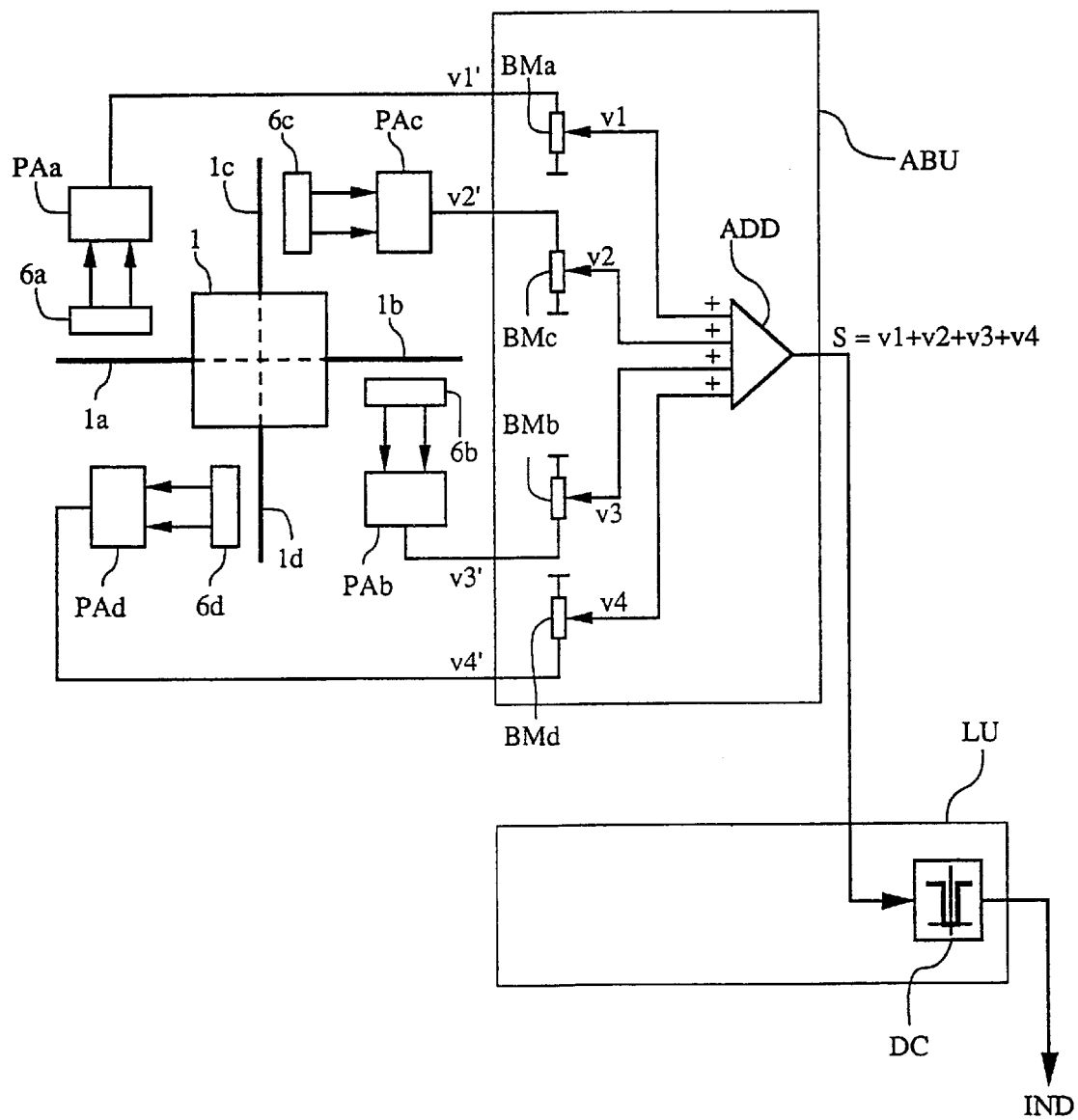
FIG. 2A shows a device according to the invention in a test object with four connection conductors and one sensing device at each of these.

FIG. 2A shows a test object with four connection conductors 1a, 1b, 1c, 1d, which, within the test object, are in galvanic connection with each other. Each of the connection conductors is associated with a sensor 6a, 6b, 6c, 6d and a filter unit PAa, PAb, PAc, PAd, respectively, of the same kind and arranged in the same way as those described with reference to FIG. 1. The output signals from the respective bandpass filters, designated v1', v2', v3', v4', are supplied, in a manner analogous to that described for the device with reference to FIG. 1, to weighting means BMa, BMb, BMc, BMd, and the output signals v1, v2, v3, v4 from these are supplied to the adding member. The sum signal S from the adding member, which thus in this embodiment consists of the sum of the signals v1, v2, v3 and v4, is supplied to the discriminator DC which delivers the indicating signal IND when the sum signal exceeds a preselected comparison value.

FIG. 2B shows a typical appearance of the signals v1, v2, v3, v4 and S, plotted on the vertical axis in the diagrams, as a function of time, plotted on the horizontal axis, in case of an electric discharge in the test object, when sensors sense current pulses which essentially simultaneously flow through all the connection conductors, either out from, or into, the test object. All the signals v1, v2, v3, v4, which substantially have the shape of a damped sinusoidal oscillation, are then essentially in the same phase position, and therefore the maximum amplitude of the sum signal consists at least approximately of the sum of the maximum amplitudes of the signals v1, v2, v3 and v4.

FIG. 2C shows a typical appearance of the signals v1, v2, v3, v4 and S in case of an electric discharge outside the test object. The current pulses associated with the discharge reach the test object via the connection conductor 1b and pass through the test object in order to leave this through the connection conductors 1a, 1c and 1d. The signals v1, v2 and v4 will have essentially the same phase position whereas the signal v3 is essentially in reverse phase, and therefore the maximum amplitude of the sum signal consists of the sum of the maximum amplitudes of the signals v1, v2, v4, reduced by the maximum amplitude of the signal v3.

Figure 3A:
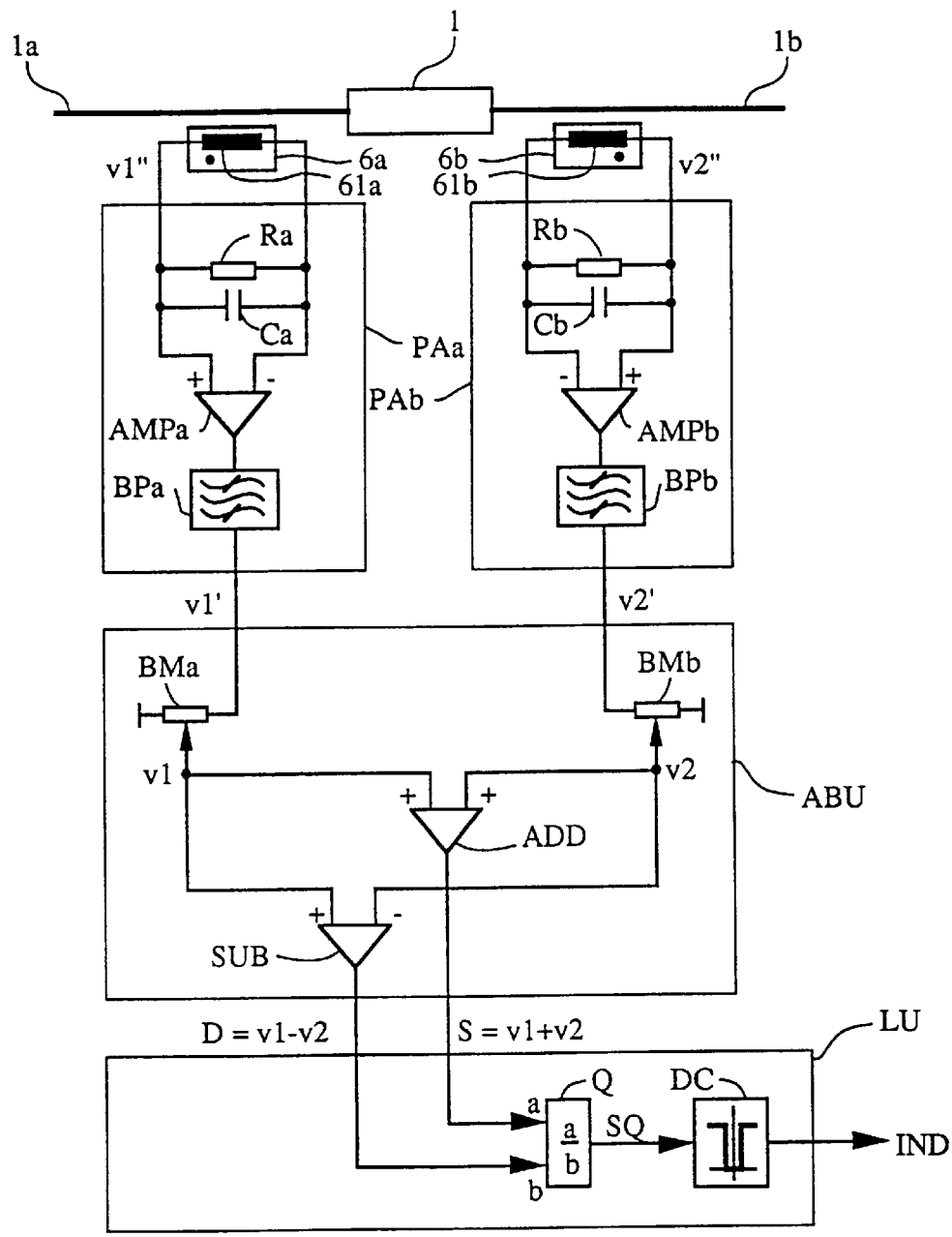
FIGS. 3A–3B show embodiments of evaluation equipment in a further development of the device according to FIG. 1, FIGS. 3C–3D show sensor signals in a device according to FIGS. 3A–3B during a discharge in, and outside, the test object, respectively.

An advantageous improvement of the invention, as described with reference to FIG. 1, is shown in FIG. 3A. The signal-mixing unit ABU comprises, in addition to the adding member ADD, also a subtracting member SUB. The output signals v1, v2, respectively, from the weighting members are supplied to the subtracting member, the output signal D of which constitutes a difference signal formed as the difference of the signals v1 and v2. The sum signal S, and the difference signal D, are supplied to a comparing member Q in the form of a quotient generator which is arranged in the logic unit LU and forms the quotient of the sum and difference signals. The output signal SQ from the comparing member is supplied to the discriminator DC which delivers an indicating signal when the signal SQ exceeds a preselected comparison value.

It is realized from the foregoing description that the amplitudes of the respective sum and difference signals will be in reverse proportion to each other dependent on whether the sensors indicate external interference pulses, associated with discharges outside the test object, or interference pulses associated with discharges in the test object. In the former case, the maximum amplitude of the sum signal will be comparatively low, whereas the amplitude of the difference signal will be comparatively high, whereas in the latter case the conditions are the reverse. The comparison between the sum and difference signals thus results in an increased sensitivity in the determination of the origin of the discharges.

Figure 3B:
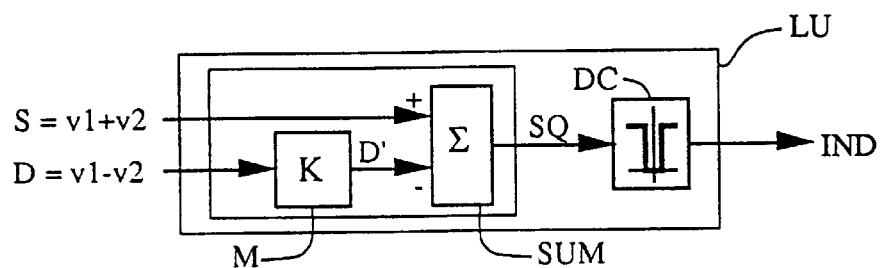

The comparing member Q may, in another embodiment illustrated in FIG. 3b, comprise a multiplier M and a summator SUM. In the summator there is formed as an output signal SQ the difference of the sum signal S and a signal D', where the signal D' is formed of the difference signal D, multiplied in the multiplier by an optional constant K. The constant K may be chosen to be of the typical order of magnitude of 2 to 3.

FIG. 3C shows a typical appearance of the signals v1, v2, the sum signal S=v1+v2 and the difference signal D=v1−v2, plotted on the vertical axis in the diagrams, as a function of time, plotted on the horizontal axis. In case of an electric discharge in the test object, the sensors sense current pulses which essentially simultaneously flow through all the connection conductors, either out from or into the test object. The signals v1, v2 then have essentially the same phase position, and therefore the maximum amplitude of the sum signal comprises at least approximately the sum of the maximum amplitudes of the signals v1 and v2, whereas the maximum amplitude of the difference signal becomes at least approximately zero.

FIG. 3D shows a typical appearance of the signals v1, v2, the sum signal S=v1+v2 and the difference signal D=v1−v2 in case of an electric discharge outside the test object. The signals v1 and v2 are essentially in reverse phase, and therefore the maximum amplitude of the difference signal comprises of at least approximately the sum of the amounts of the maximum amplitudes of the signals v1 and v2, whereas the maximum amplitude of the sum signal becomes at least approximately zero.

Figure 4:
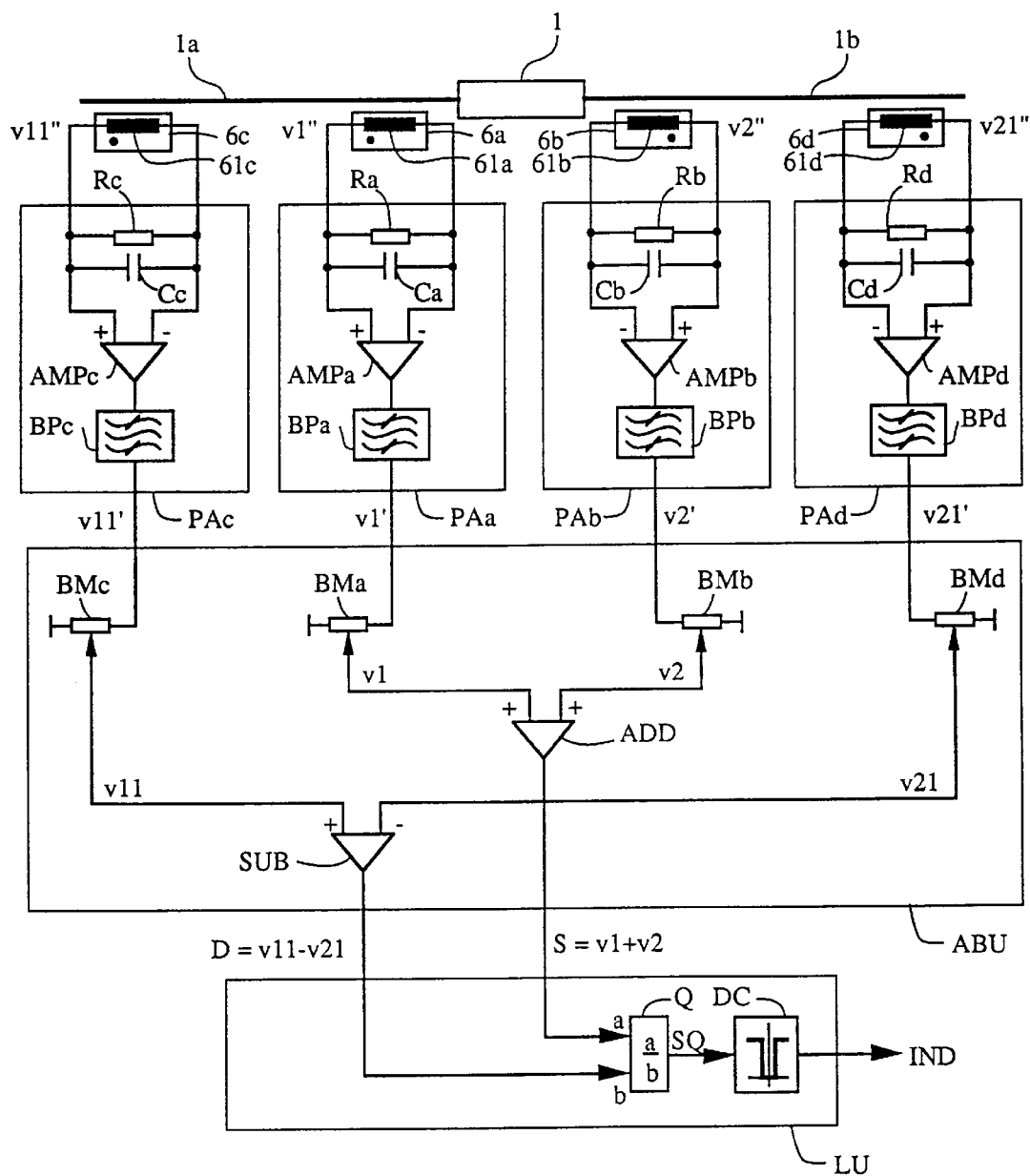
FIG. 4 shows embodiments of sensor equipment in a further development of the device according to FIG. 1.

A corresponding increase of the sensitivity of the device in the determination of the origin of the discharges may be achieved with an embodiment of the device illustrated in FIG. 4. Each of the connection conductors of the test object is associated with two sensors 6a, 6c and 6b, 6d, respectively, each with an associated filter unit and an associated weighting member PAa, PAc, Ba, Bc and PAb, PAd, BMb, BMd, respectively. Sensors for sensing current pulses flowing through the same connection conductor are adapted to deliver sensor signals of the same polarity when a current pulse flows through the connection conductor. The sum signal S is formed in the same way as has been described with reference to FIG. 1 as a sum formed in dependence on sensor signals originating from the sensors 6a and 6b, whereas the difference signal is formed in the subtracting member SUB in dependence on sensor signals originating from the sensors 6c and 6d. It should be realized that sum and difference signals will have similar appearances, both in the embodiment according to FIG. 3A and in the embodiment according to FIG. 4.

Figure 5:
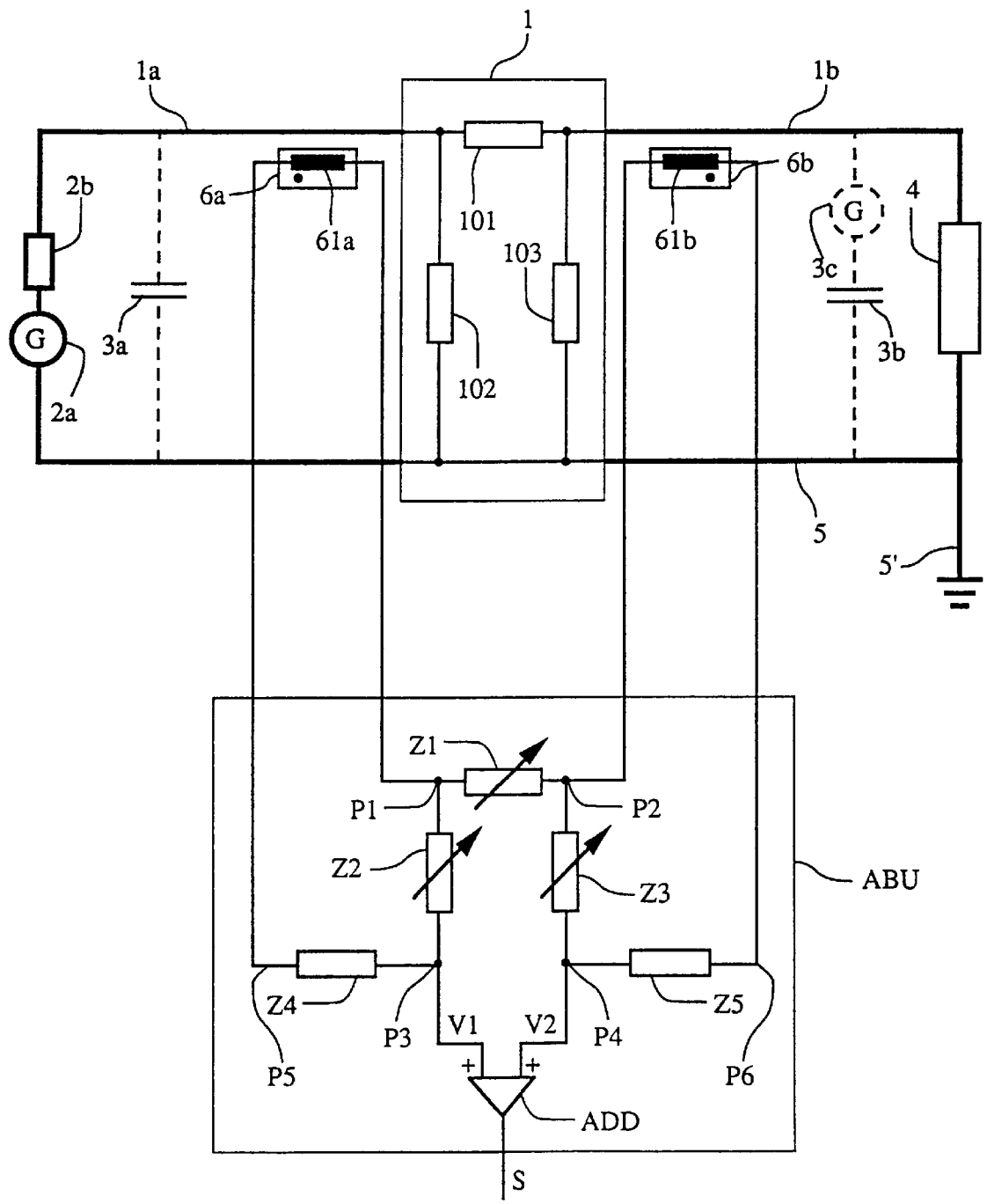
FIG. 5 shows an embodiment of evaluation equipment in a further development of the device according to FIG. 1, comprising a model of the test object.

FIG. 5 illustrates a further improvement of the invention, which is especially advantageous when the test object exhibits an impedance which, in the frequency range used for sensing of current pulses, in a manner disturbing the sensing, dampens the amplitude of and/or phase-shifts currents passing through the test object via the connection conductors thereof. The test object 1 is shown in this figure depicted as a Π-network comprising three impedance elements 101, 102 and 103, of which the first one is connected between the connection conductors 1a and 1b, whereas the last two ones are connected between the conductor 5 and the connection conductors 1a and 1b, respectively. When the evaluation equipment is designed, for example, as described with reference to FIG. 1, the weighting members BMa and BMb cannot under these conditions be set so that the sum signal becomes zero, or very near zero, in case of discharges outside the test object. If the discharge is conceived to occur in the component 4, the sensor signal emanating from the sensor 6a, because of deflection and phase shift in the impedance elements representing the test object, will appear delayed in phase and damped in relation to the sensor signal emanating from the sensor 6b. Inversely, if the discharge is conceived to occur in a component connected to the connection conductor 1a of the test object, the sensor signal emanating from the sensor 6b will be delayed in phase and damped in relation to the sensor signal emanating from the sensor 6a. A satisfactory extinction of the signals v1 and v2 is thus made difficult when the test object in the frequency range in question exhibits properties which can be illustrated in a model as illustrated in FIG. 5. A compensation for these properties can, however, be achieved by comprising in the signal-mixing equipment ABU a model of the test object which damps and/or phase-shifts the signals from which the sum signal is formed in a manner which imitates the amplitude damping and/or the phase shift undergone by a current pulse passing through the connection conductors of the test object.

An example of such a model is shown in FIG. 5. It comprises three impedance elements Z1, Z2, Z3, each with a characteristic similar to that of the impedance elements 101, 102, 103 in the test object and mutually connected in a manner analogous to these at connection points P1, P2.

Further, two impedance elements Z4, Z5 are connected to the model at connection points P3, P4, which impedance elements, in the manner described above, are adjusted for tuning the sensor to a resonance frequency which is within the frequency range of interest to the sensing. Each of the sensors is connected, with one of its terminals, to the connection points P1 and P2, respectively, and with its other terminal to the connection points P5 and P6, respectively, at the impedance elements Z4 and Z5. Signals v1 and v2 are sensed at the connection points P3 and P4 and are supplied to the adding member ADD. For example, by sensing of an interference pulse, externally applied in some known manner the impedance elements Z1, Z2, Z3 may be set such that the output signals v1 and v2 from the model will have the same amplitude and phase position, whereby the sum signal S becomes zero for discharges outside the test object.

FIGS. 6A–6D show an embodiment of a sensor 7, which is particularly advantageous in those cases where the test object comprises of a coil for a stator winding for an electric power generator and this coil is located in a winding slot in the stator of the generator in which a further coil is located.

FIG. 6A shows the sensor in a side view. A thin insulated conductor is wound with a plurality of turns around a thin rectangular disc 72 of magnetically conducting material, for example iron, with low hysteresis losses, to form a coil 71 with two terminals 73, 74. The coil has its axis parallel to a short side of the rectangular disc and is surrounded by a screen 75 of an electrically conductive material, for example aluminium foil. The sensor is shown in FIG. 6A with the screen cut-away to the left of a section B—B. FIG. 6B shows the sensor as viewed from the section B—B. FIG. 6D shows the sensor embedded in a disc 76 of laminated plastic and with the terminals of the coil withdrawn from the disc in a slot 761 therein via a coaxial cable 77. FIG. 6C shows a cross section of part of a stator for a generator with a winding slot 8. Two coils 81, 82 are located in the winding slot and the sensor is placed between two adjacent coil sides of the two coils.

FIGS. 7A–7C show an embodiment of a sensor 7 of a composition similar to that described with reference to FIGS. 6A–6D, but with the difference that the coil has its axis parallel to a long side of the rectangular disc. By, for example, winding the coil around a disc of amorphous iron, the sensor can be made flexible in the longitudinal direction of the disc and, for example, be applied around a cable 9 as illustrated in FIG. 7C.

The sensors described with reference to FIGS. 6A–6D and 7A–7C are suitable to use in a frequency range of typically 0.1–5 MHz. The coils of the sensors can also be wound around a disc of a non-magnetic material.

Figure 8A:
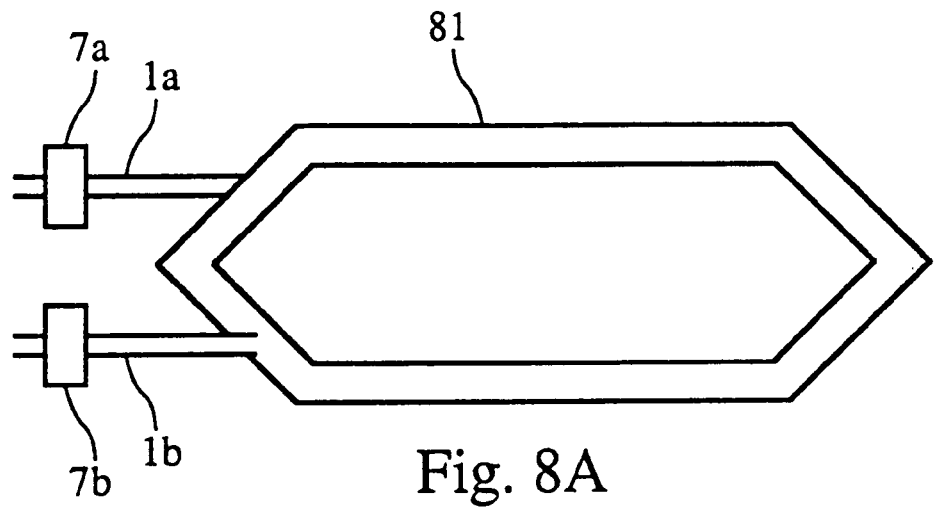
FIGS. 8A–8D show further embodiments of a sensor in a device according to the invention.
Figure 8B:
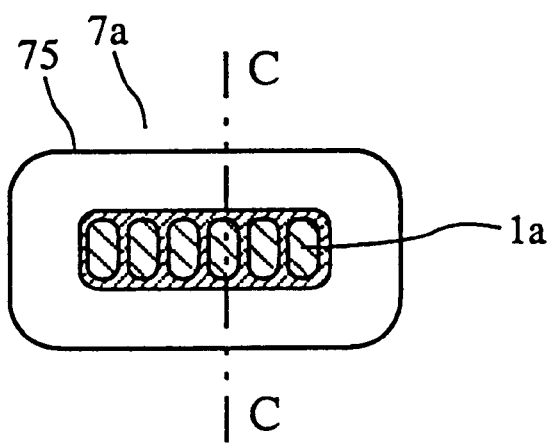
Figure 8C:
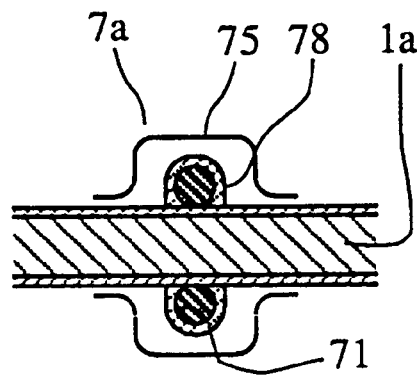
Figure 8D:
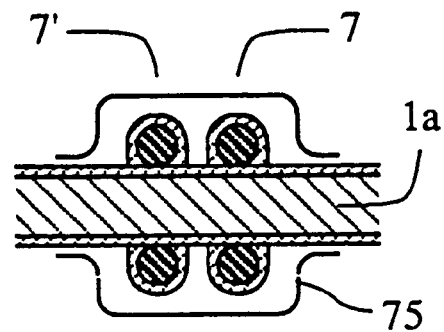

FIGS. 8A–8D show an embodiment of a sensor 7, comprising a Rogowski coil 71, which may advantageously be applied around the connection conductor of the test object. The test object, in FIG. 8A exemplified by a coil 81 for a stator winding for an electric power generator, has sensors 7a and 7b, respectively, arranged at the respective connection conductors 1a, 1b. FIG. 8B shows a cross section through the connection conductor 1a and FIG. 8C shows a section C—C through the coil and the connection conductor. The coil 71 is wound with typically 10 to 30 turns around a core of epoxy and embedded in a layer 78, also of epoxy. The embedded coil is surrounded by an outer screen 75 of electrically conductive material, for example aluminium sheet. FIG. 8D shows a section C—C through the connection conductor with two sensors 7 and 7' within a common screen 75.

Figure 9A:
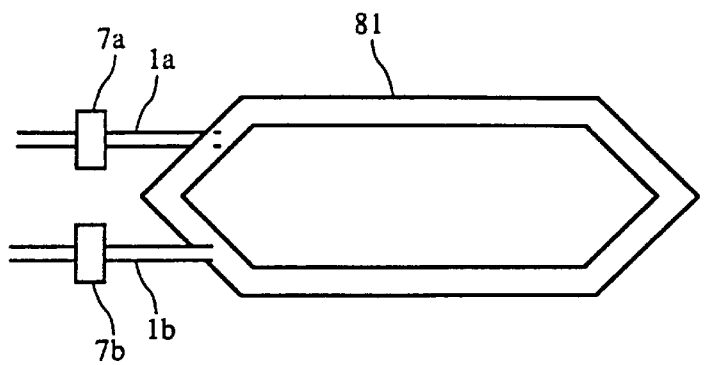
FIGS. 9A–9C show further embodiments of a sensor in a device according to the invention.
Figure 9B:
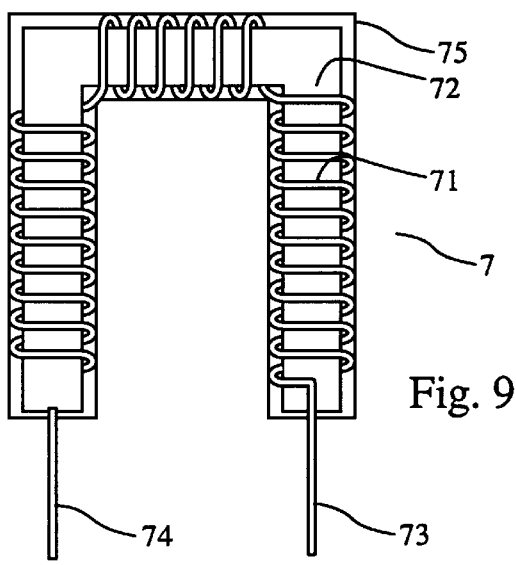
Figure 9C:
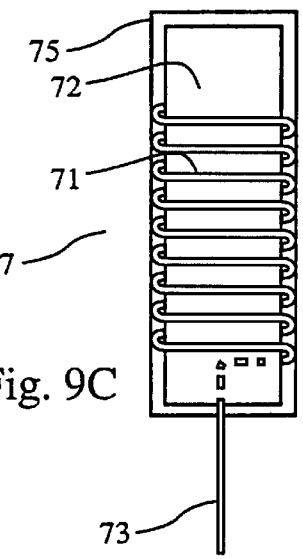

FIGS. 9A–9C show an additional embodiment of a sensor 7. A coil 71 is wound around a U-shaped core 72 of a dielectric material, alternatively of amosphous iron, and the coil is surrounded by a screen 75 of an electrically conductive material, for example aluminium foil, covered by a plastic film (not shown in the figure). FIG. 9A shows sensor of this kind applied to the connection conductors 1a, 1b of a coil 81 of a stator winding for an electric power generator. FIGS. 9B and 9C show a view of the sensor as viewed in the longitudinal direction of the connection conductor and perpendicular thereto, respectively. A capacitor (not shown in the figure) may be arranged at the two terminals 73, 74 of the coil for tuning the resonance frequency of the sensor.

Figure 10:
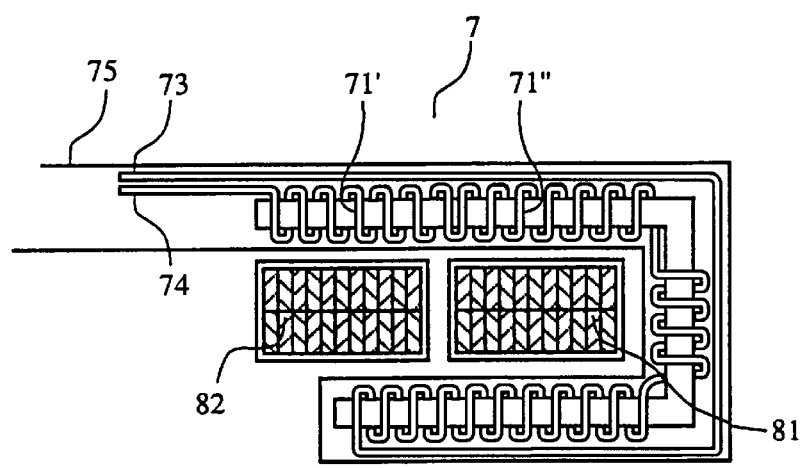
FIG. 10 shows a further embodiment of a sensor in a device according to the invention.

FIG. 10 shows an improvement of the transducer according to FIGS. 9A–9C, which may advantageously be used when the test object comprises of a coil in a stator winding for an electric generator in those cases where an additional coil is disposed in the same winding slot. FIG. 10 shows a cross section through two coils 81, 82, disposed in a common stator slot (not shown in the figure). Around the two coils a sensor is arranged which is composed of a U-shaped core of the same kind as that described with reference to FIGS. 9A–9C. On condition that the test object consists of a coil 81, in this case and with a coil wound as described with reference to FIGS. 9A–9C, because of the connection between coil 81 and coil 82, also a discharge in coil 82 would give rise to a sensor signal. By dividing the coil into two mutually series-connected parts 71' and 71", respectively, wound in opposite directions around the core, and by a suitable choice of the ratio between the number of turns in part 71', and part 71" and by arranging part 71" at the coil 81 and part 71' at the coil 82, the effect of discharges in the coil 82 can be reduced.

Figure 11A:
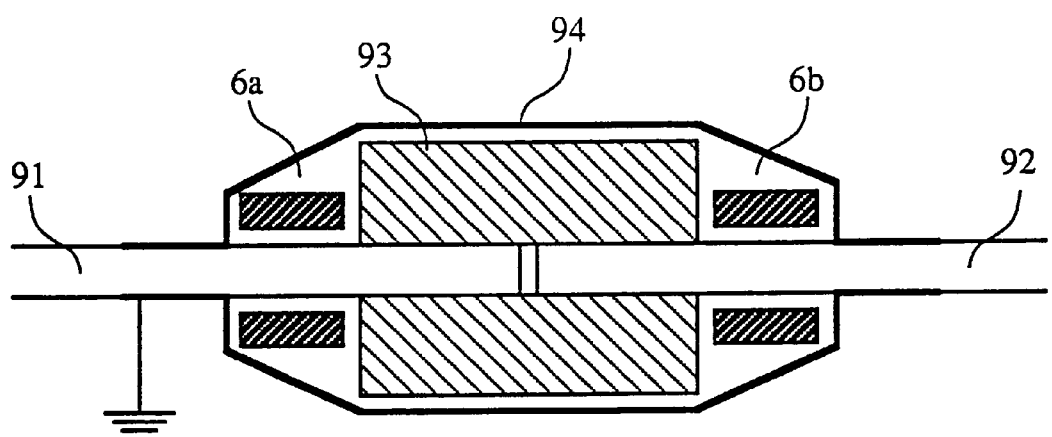
FIGS. 11A–11B show embodiments of sensing equipment when the test object consists of a cable joint.
Figure 11B:
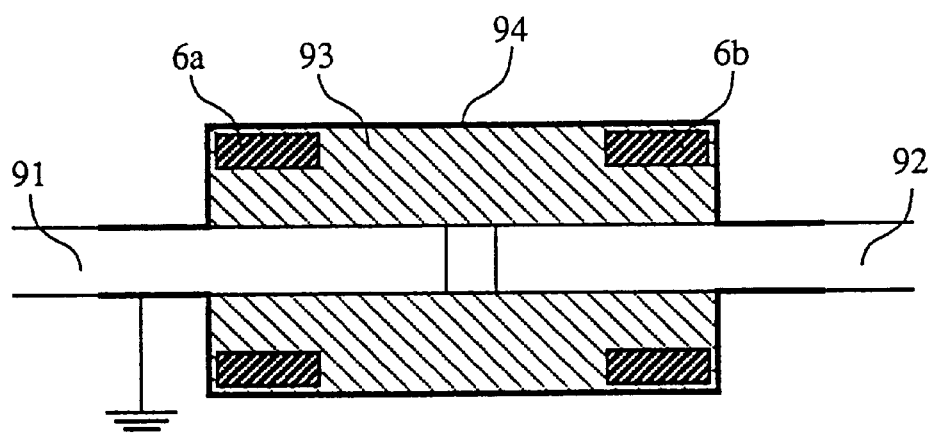

FIGS. 11A–11B show schematically, in a longitudinal section, a location of a sensor in case the test object consists of a cable joint. Two cable ends 91, 92 are joined to each other in a known manner, by means of a sleeve 93, surrounded by a grounded screen 94. FIG. 11A illustrates the case where the screen is separated from the sleeve, in which case it is advantageous to arrange the transducer 6a, 6b, exemplified in the figure by Rogowski coils, at the cable ends in the longitudinal direction of the cable between the sleeve and the screen. FIG. 11B illustrates the case in which the screen is integrated with the sleeve, wherein the transducer can be embedded in the sleeve at the locations indicated in the figure.

Figure 12:
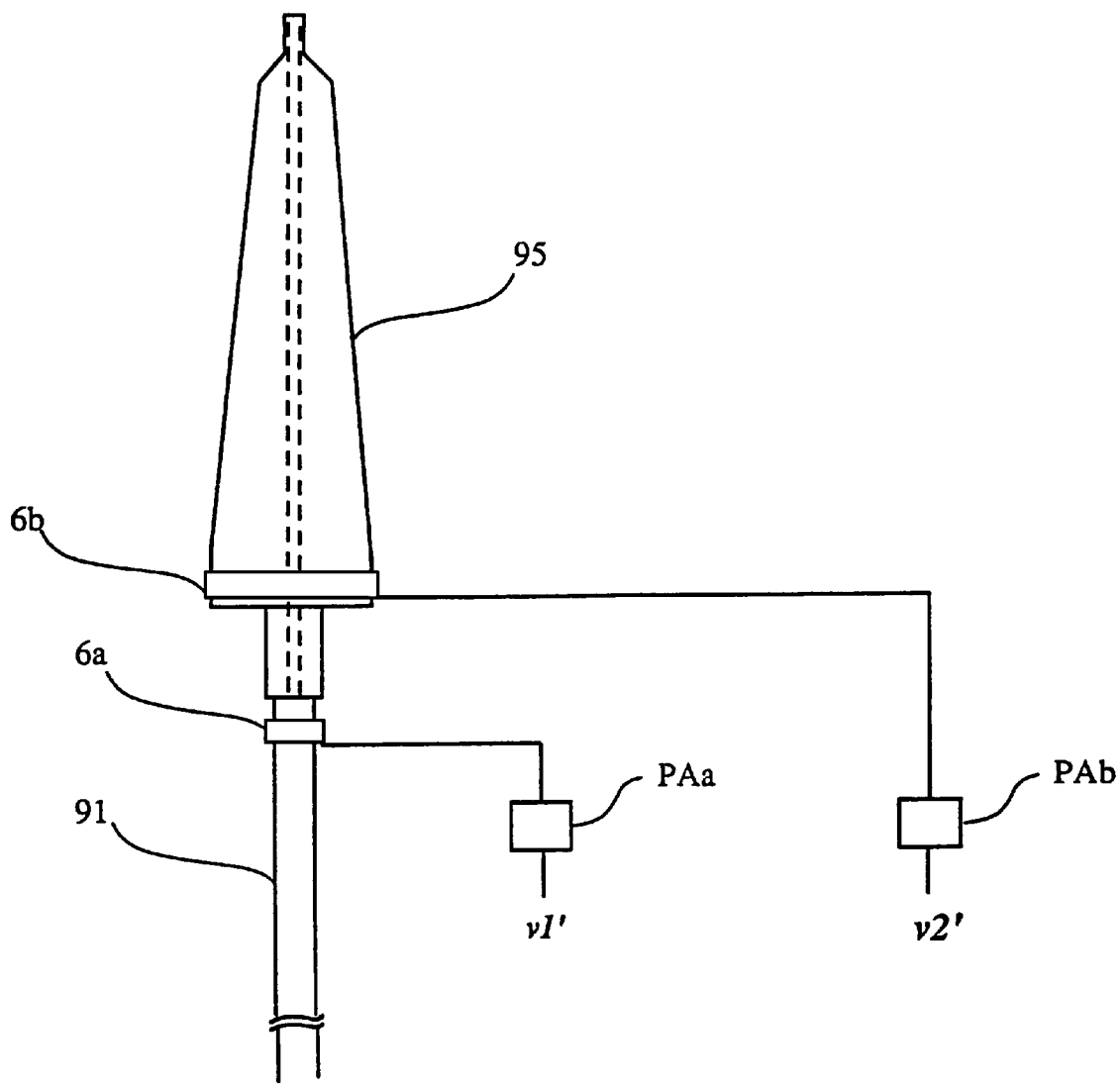
FIG. 12 shows embodiments of sensor equipment when the test object consists of a cable termination.

FIG. 12 shows schematically a location of a sensor in case the test object consists of a cable termination. A cable 91 is terminated in a known manner by a termination device 95. In this case it is advantageous, as marked in the figure, to arrange sensors 6a, 6b, exemplified in the figure by Rogowski coils, at the cable near the cable termination and around the terminating flange of the cable termination, respectively. A current pulse associated with a discharge outside the cable termination thereby passes through both coils, causing the sum signal to become at least approximately zero. In case of a discharge in the cable termination, a current pulse will flow to the grounding screen surrounded by the transducer 6b and arranged in the cable termination. This current pulse comprises of the sum of the current pulses passing through the connection conductors of the cable termination and is sensed by the sensor 6b whereas, under these conditions, the sensor 6a only senses the current pulse which passes through the cable 91.

Figure 13:
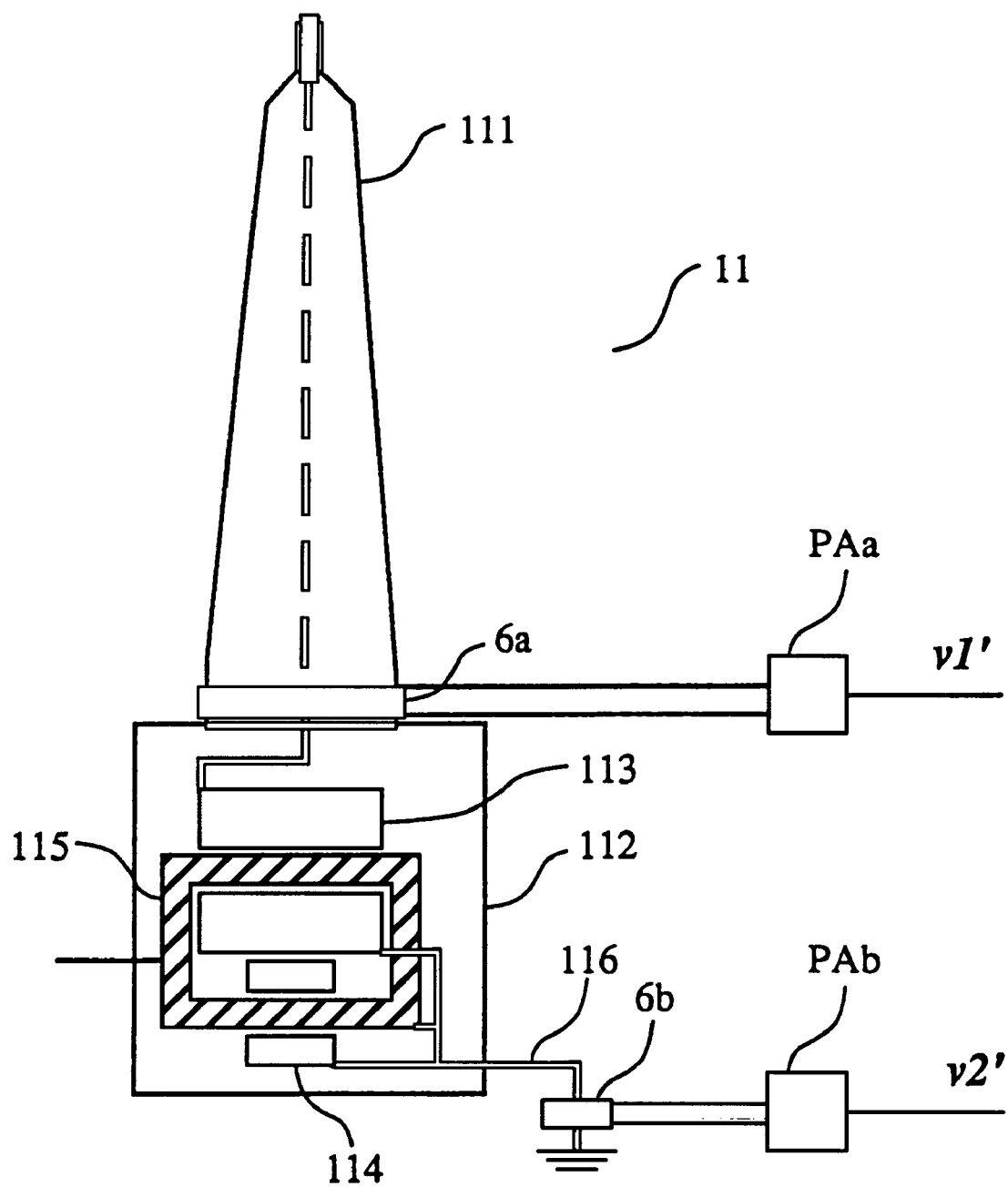
FIG. 13 shows embodiments of sensing equipment when the test object consists of a voltage transformer.

FIG. 13 shows schematically a location of a sensor in case the test object comprises of an instrument transformer for measuring voltage. A single-phase voltage transformer 11 comprises a high-voltage bushing 111 and a box 112 shown in cross section. A high-voltage winding 113 and a low-voltage winding 114, shown in cross section, are arranged on a common core 115 in the box. The high- and low-voltage windings and the core are connected to ground potential by means of a conductor 116. In this case, it is advantageous, as marked in the figure, to arrange sensors 6a, 6b, exemplified in the figure by Rogowski coils, around the lower part of the high-voltage bushing near the box and at the conductor 116 outside the box.

Figure 14A:
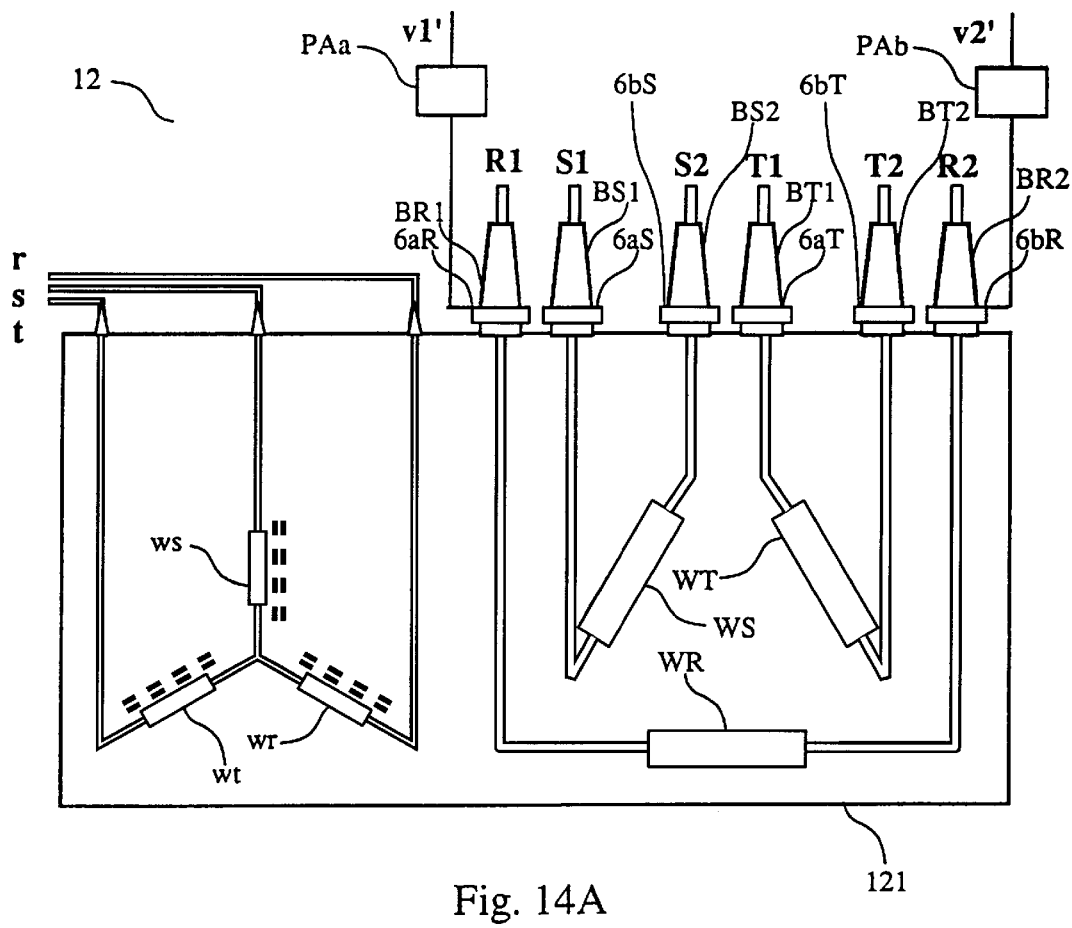
FIG. 14A shows embodiments of sensing equipment when the test object consists of a three-phase power transformer.
Figure 14B:
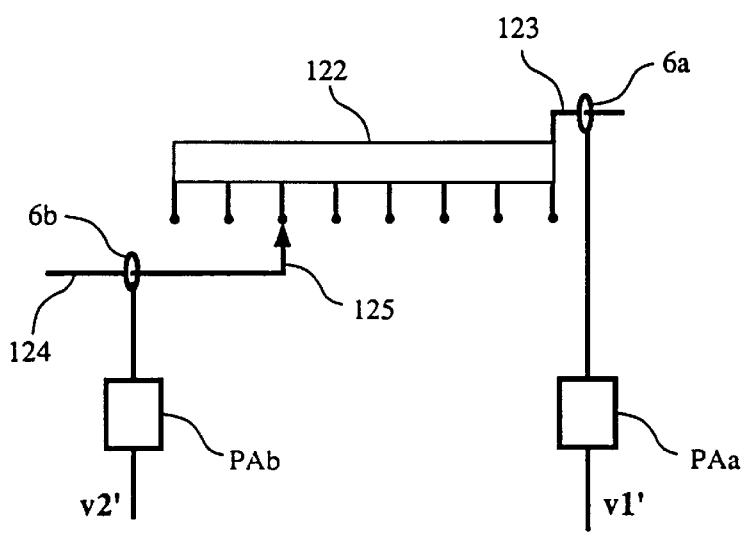
FIG. 14B shows embodiments of sensing equipment when the test object consists of a tap-changer for a power transformer.

FIGS. 14A–14B schematically show a location of a sensor in case the test object comprises of a high-voltage winding for a power transformer and a tap-changer, respectively. A three-phase power transformer 12 comprises a box 121 and high-voltage windings WR, WS, WT, each one passing out of the box via bushings BR1, BR2, BS1, BS2, BT1, BT2, respectively (FIG. 14A). In this case, it is advantageous, as marked in the figure, to arrange sensors 6aR, 6bR, 6aS, 6bS, 6aT, 6bT, exemplified in the figure by Rogowski coils, around the lower part of the respective bushing near the box. A tap-changer, of which one phase is schematically shown in FIG. 14B, has a connection conductor 123 secured to the winding 122 and the other connection conductor 124 connected to the contact 125, which is movable along the winding, and sensors 6a, 6b are arranged at the respective connection conductor.

In case the test consists, for example, of a three-phase reactor, sensors can placed in a manner completely analogous to that described with reference to FIG. 14A.

In case the test object comprises, for example, a power capacitor, depending on its connection to the other parts of the power network in which it is included, a sensor can be placed in a manner analogous to that described with reference to FIGS. 13–14, i.e., at the high-voltage bushing of the power capacitor and at a conductor to ground potential outside the enclosure of the power capacitor, or at a pair of the high-voltage bushings of the power capacitor.

FIGS. 15A–15B, 16, 17A–17B and 18 show schematically examples of the location of sensors in case the test object consists of a high-voltage bushing for an electric high-voltage apparatus. A high-voltage bushing 13, arranged on a cover 133 of an electric high-voltage apparatus, comprises an external connection conductor 131, arranged in an insulator 132, for example of porcelain. The external connection conductor passes through a flange 134 down into the lower part 135 of the bushing, located in the interior of the high-voltage apparatus.

Figures 15A, 15B:
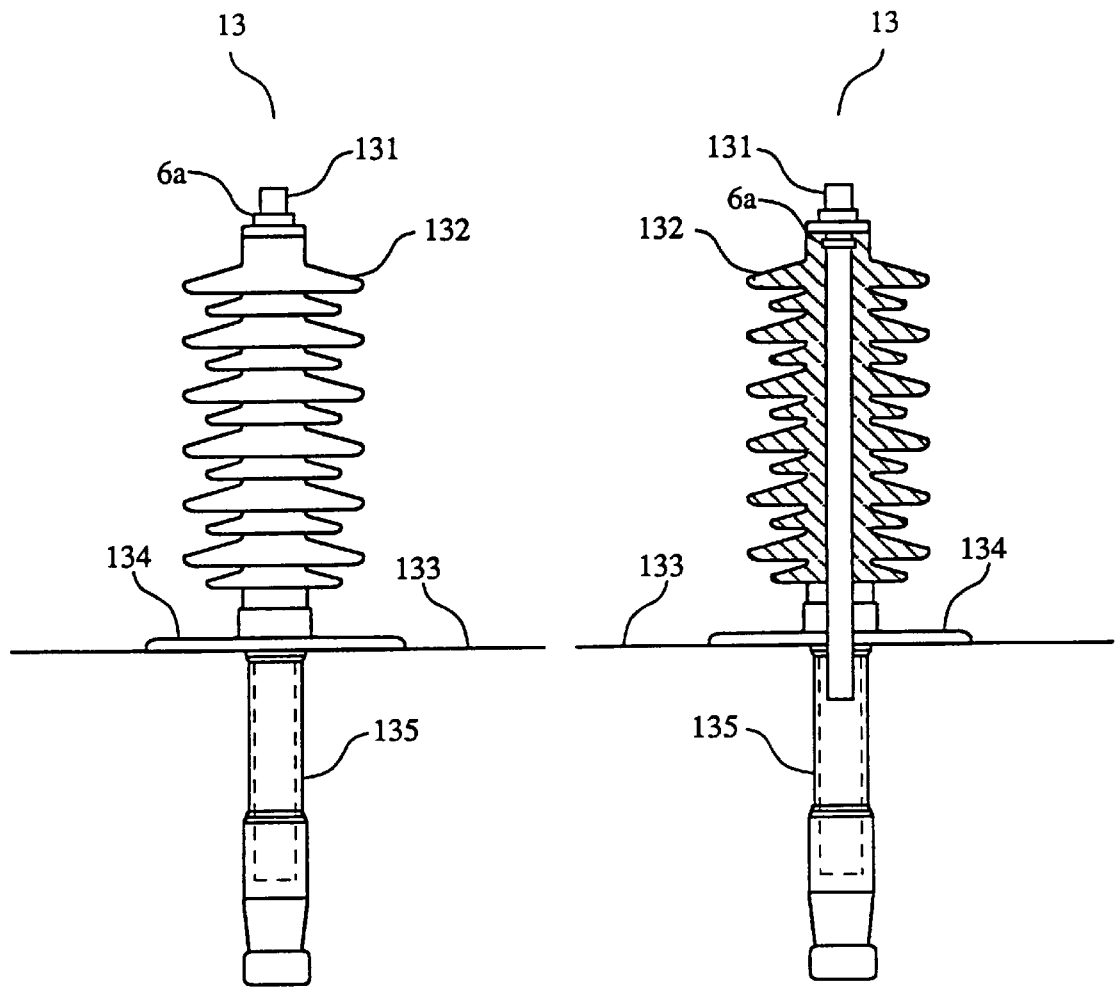
FIGS. 15A–15B, FIG. 16, and FIGS. 17A–17B show embodiments of sensing equipment when the test object consists of a high-voltage bushing.

FIG. 15A shows a sensor 6a, exemplified in the figure by a Rogowski coil, arranged around the outer connection conductor of the high-voltage bushing above the insulator. FIG. 15B, in which the insulator is shown cut up, shows a sensor 6a, exemplified in the figure by a Rogowski coil, arranged around the outer connection conductor of the high-voltage bushing inside the insulator and at the upper part thereof.

Figure 16:
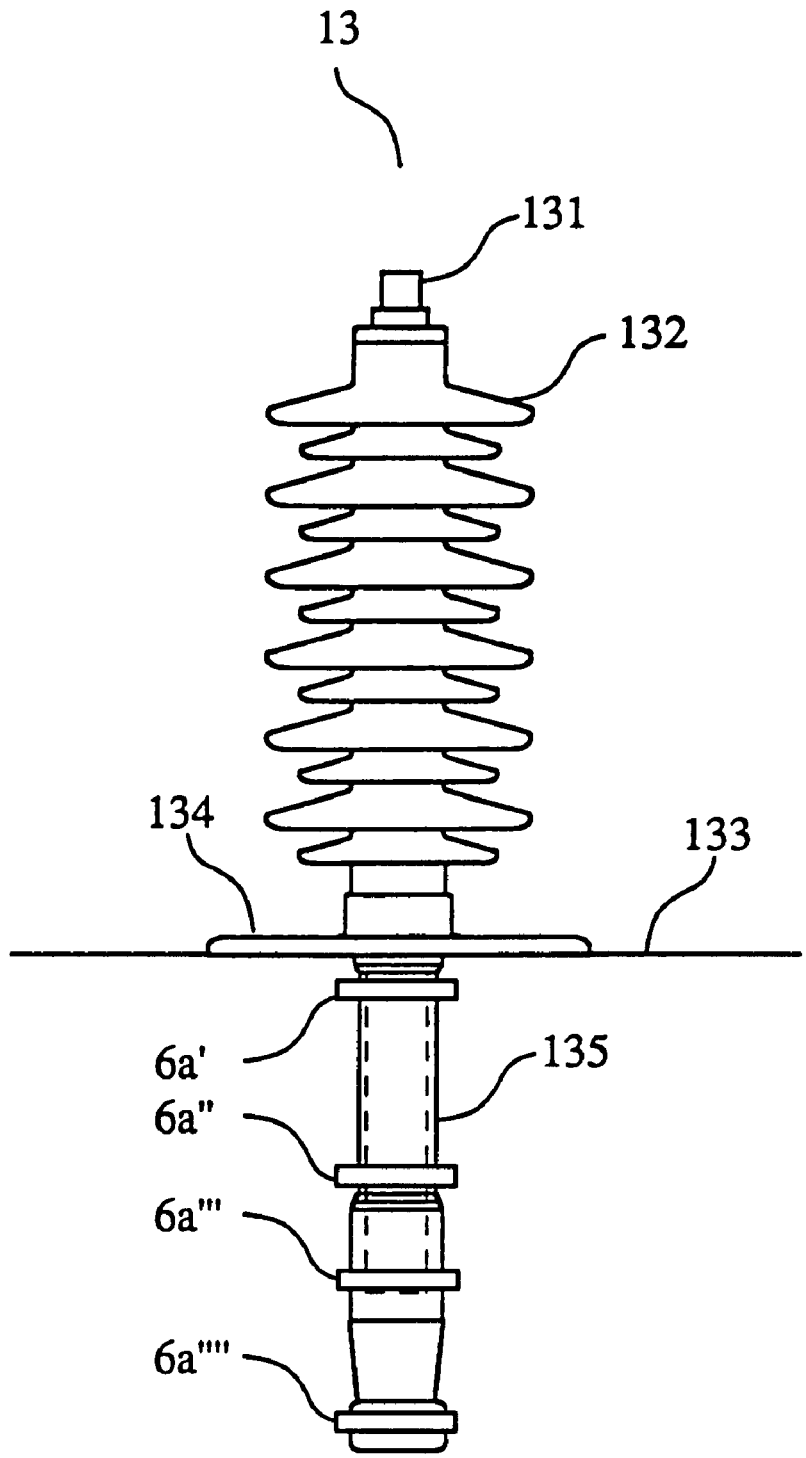

FIG. 16 shows a number of alternative locations of a sensor 6a', 6a", 6a"', 61"", exemplified in the figure by a Rogowski coil, arranged around the lower part of the high-voltage bushing.

Figure 17A:
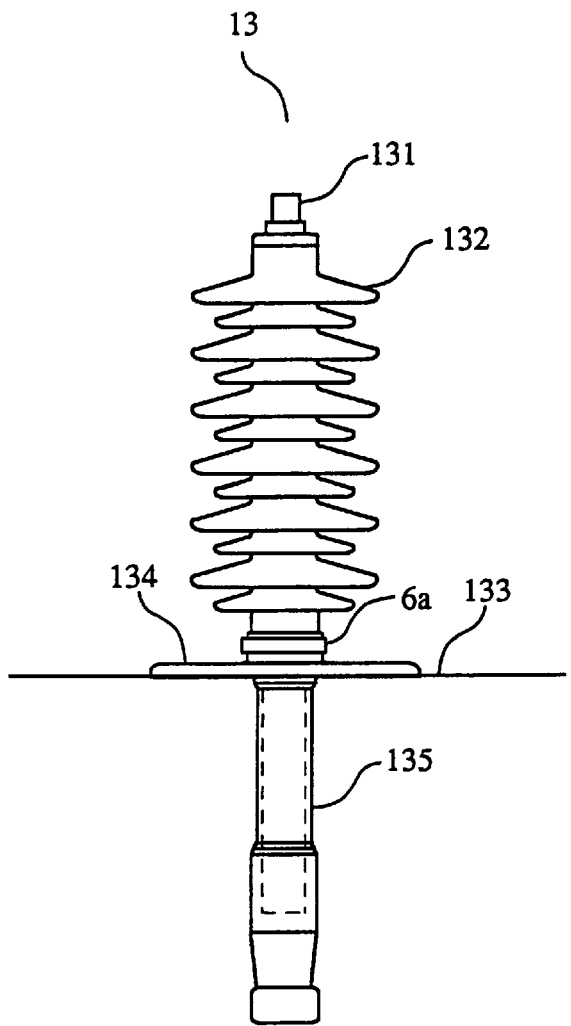

FIG. 17A shows a sensor 6a, exemplified in the figure by a Rogowski coil, arranged around the lower part of the insulator in the vicinity of the flange.

Figure 17B:
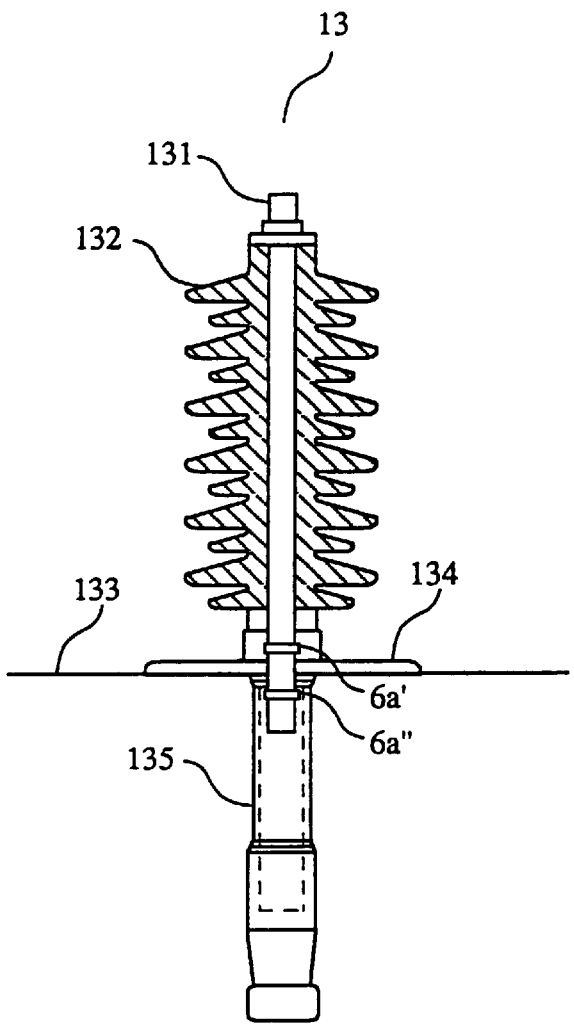

FIG. 17B shows a number of alternative locations of sensors 6a', 6a", exemplified in the figure by Rogowski coils, arranged around the outer connection conductors of the high-voltage bushing inside the insulator and at the lower part thereof and below the cover, respectively.

Figure 18:
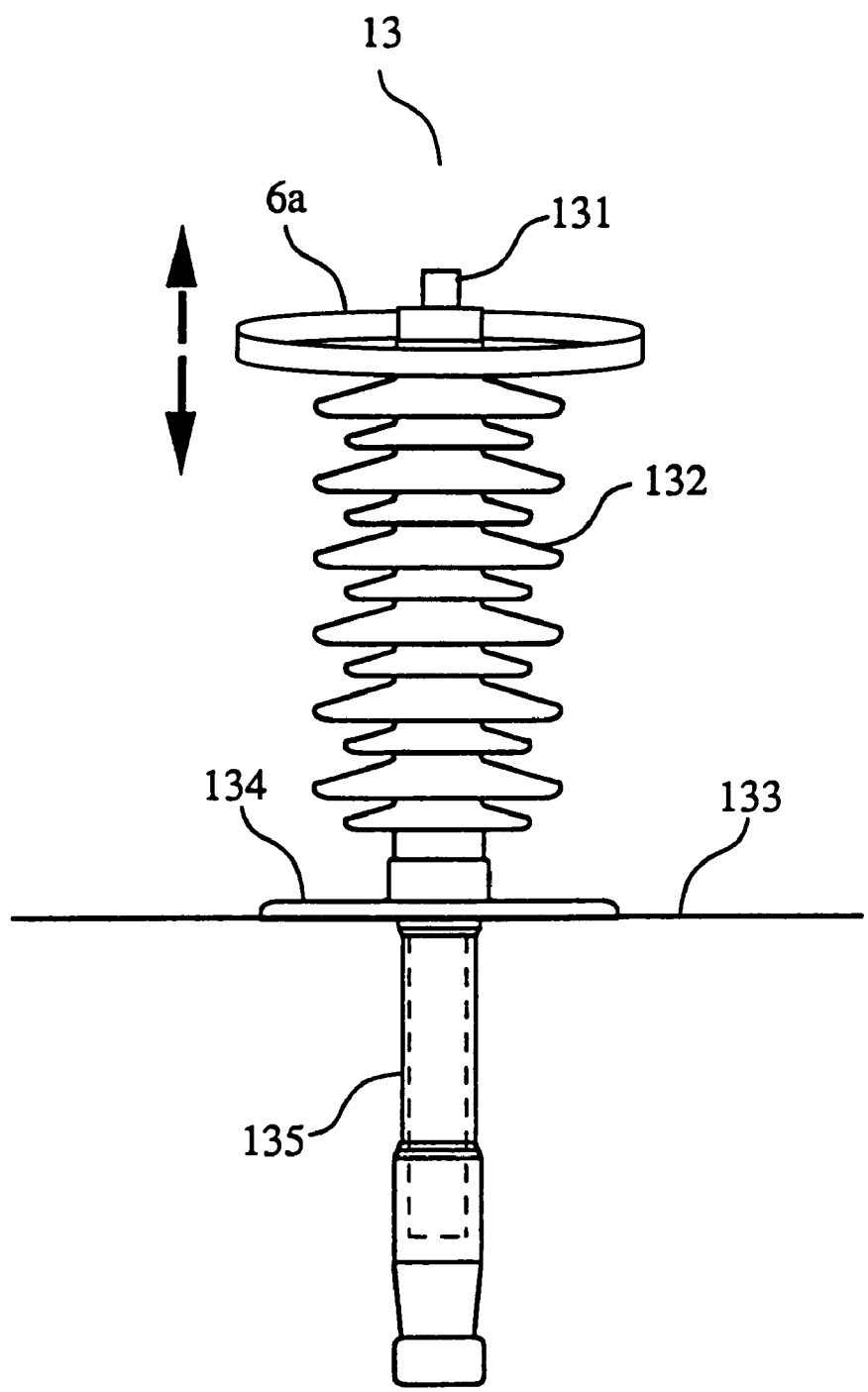
FIG. 18 shows an embodiment of movable sensing equipment when the test object consists of a high-voltage bushing.

FIG. 18 shows a sensor 6a, exemplified in the figure by a Rogowski coil, arranged around the insulator and arranged movable along this. Such a sensor may advantageously be used in combination with a sensor 6b, placed, for example, as illustrated in FIG. 16.

It is clear from the foregoing that by summing signals originating from a sensor placed according to any of the ways shown in FIGS. 15A–15B, 16, 17A–17B and 18, the location of electric discharges in a desired part of the elongated test object is made possible. By combining, for example, the movable sensor 6a, as shown in FIG. 18, with a fixed sensor 6a', as shown in FIG. 16, by moving the movable sensor a discharge may be located in a defined part of the test object, and by arranging two movable sensor along this, the location can take place completely freely along the test object.

Figure 19:
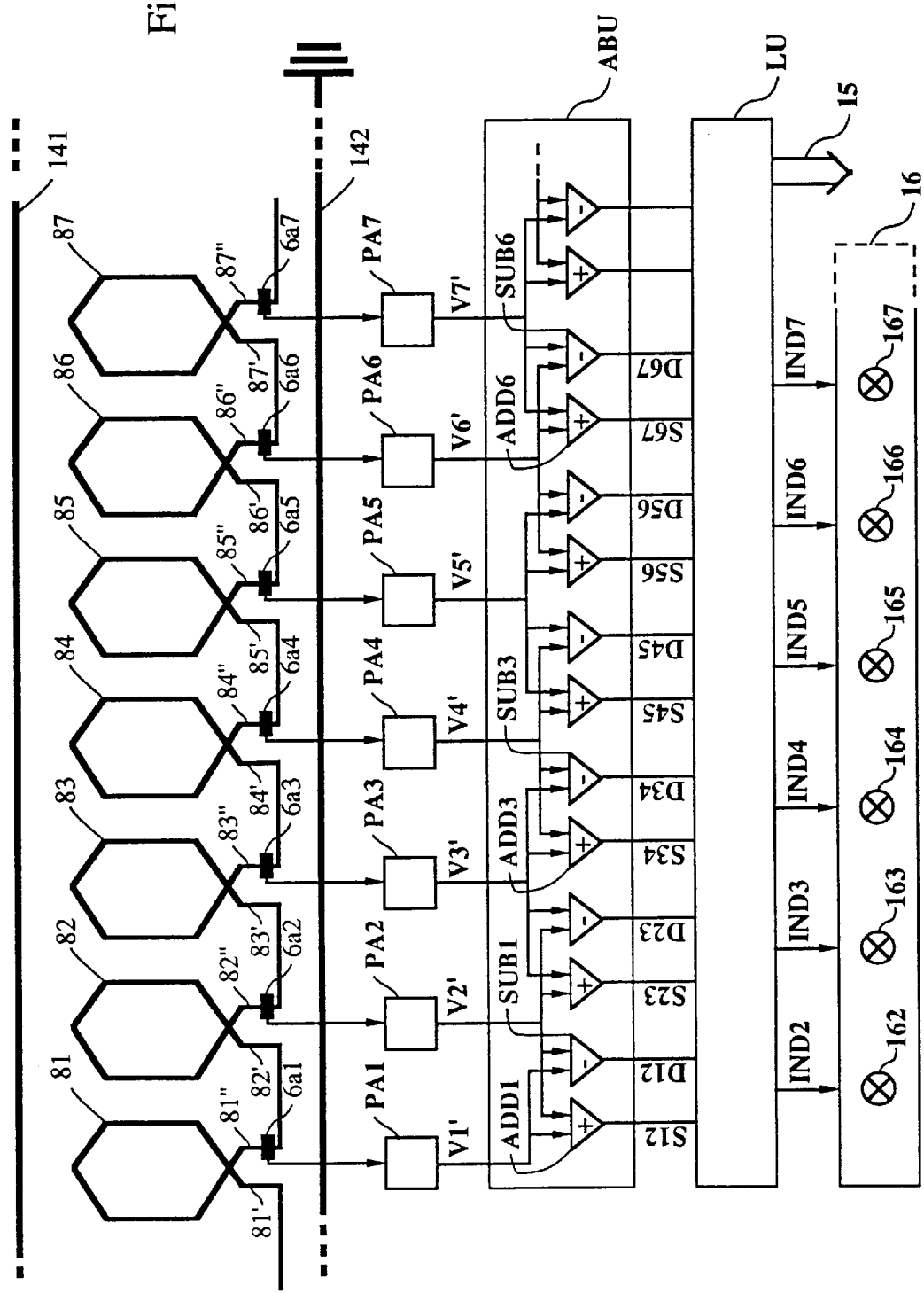
FIG. 19 shows an embodiment of the invention when the test object consists of a high-voltage generator.

FIG. 19 shows an application of the invention when the test object consists of a plurality of mutually series-connected coils in a phase of the stator winding of an electric ac generator. A number of coils 81–87 are mutually series-connected via their terminals 81', 81"–87', 87". The iron part of the stator is symbolically marked in the figure by two lines 141, 142. At each of the terminals 81"–87", a sensor 6a1–6a7 is arranged, for example in an embodiment according to the description with reference to any of FIGS. 7–10. The respective sensor signals are supplied to filter units PA1–PA7, the output signals therefrom, designated v1'–v7', are supplied to a signal-mixing unit of an embodiment similar to that signal-mixing unit described with reference to FIG. 3. To simplify FIG. 19, however, the weighting members in the signal-mixing unit are not shown in the figure. The signal-mixing unit comprises an adding member ADD1–ADD7, associated with each transducer, and a subtracting member SUB1–SUB7, associated with each sensor, and is furthermore adapted so that each one of the adding and subtracting members is supplied with signals originating from a pair of sensors arranged at terminals to two coils arranged in a series connection adjacent to each other. Thus, for example, the adding member ADD2 and the subtracting member SUB2, respectively, are supplied with signals originating from the sensor pair 6a2, 6a3 and form sum and difference signals S23=v2+v3 and D23=v2–v3, respectively, whereas the adding member ADD3 and the subtracting member SUB3, respectively, are supplied with signals originating from the transducer pair 6a3, 6a4 and form sum and difference signals S34=v3+v4 and D34=v3–v4, respectively. All the sum and difference signals are supplied to a logic unit LU of the same kind as the logic unit described with reference to FIG. 3 and form, by combinations of associated sum and difference signals, indicating signals IND2–IND7, where the signal IND2 indicates an electric discharge in coil 82, IND3 indicates an electric discharge in coil 83, and so on. The indicating signals are forwarded to central monitoring equipment of a kind known via a databus, marked 15 in the figure, and to an indicating panel 16, comprising indicating means, for example in the form of light-emitting diodes 162–167 which light up when indicating a discharge in the respective coil.

It is realized from the foregoing and from FIG. 19 that by arranging the signal-mixing unit so that the adding and subtracting members are supplied with signals originating from a pair of sensors arranged at terminals between which are placed a number of coils arranged in series connection adjacent to each other, discharges in an optional group of mutually series-connected coils can be sensed.

Figure 20:
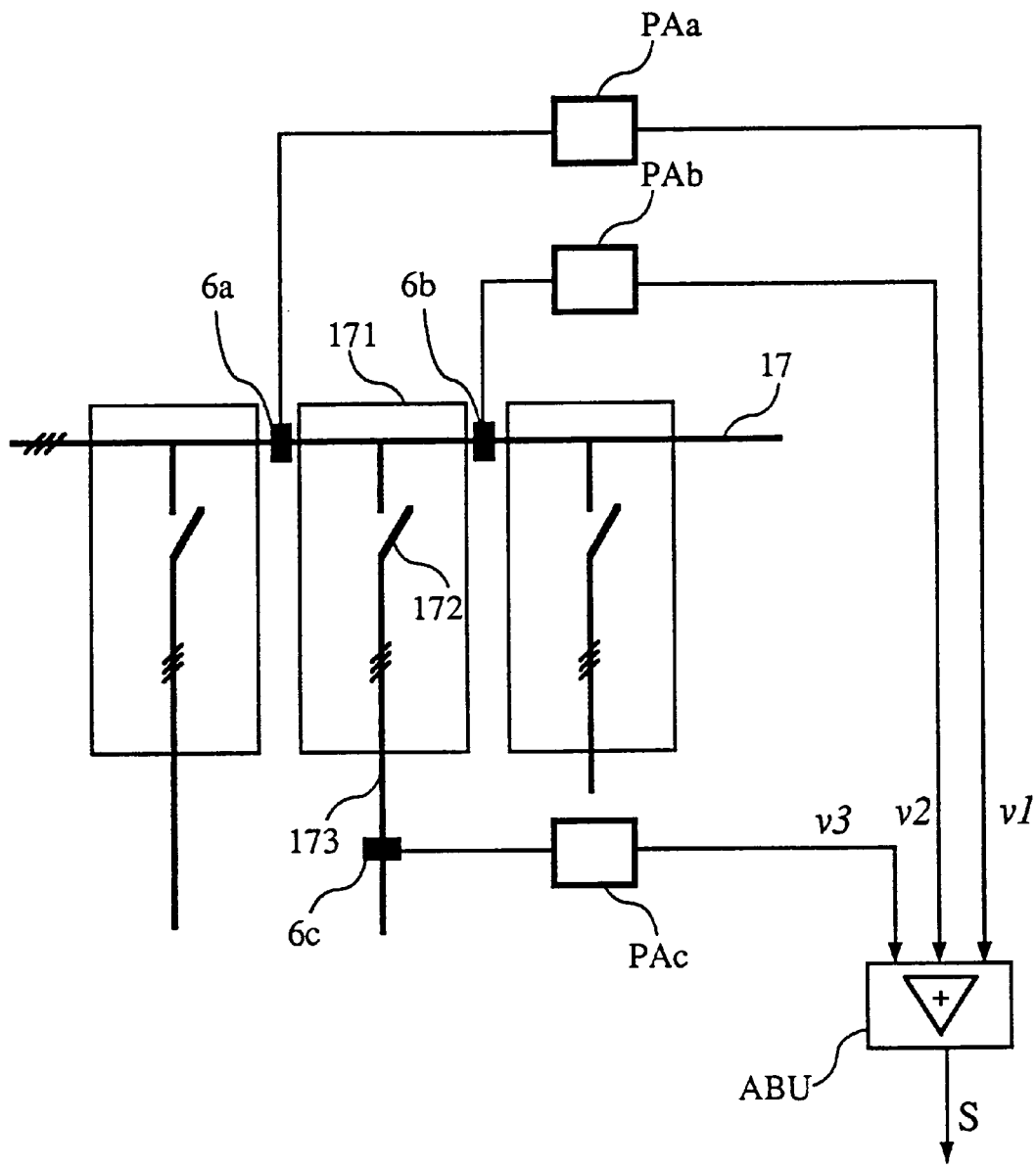
FIG. 20 shows embodiments of sensing equipment when the test object consists of a switchgear unit.

FIG. 20 shows an application of the invention when the test object comprises of a switchgear cubicle, for example in enclosed indoor medium-voltage switchgear or in gas-insulated switchgear. FIG. 20 shows parts of a switchgear unit in the form of a schematic single-line diagram. The switchgear unit comprises a continuous busbar 17 and the test object comprises a cubicle 171 comprising a circuit breaker 172 and an output line 173. Sensors 6a, 6b, 6c, exemplified in the figure by Rogowski coils, are arranged around the busbar on both sides of the switchgear cubicle 171 between this and its surrounding cubicle, and around the output line 173. The sensor signals are supplied, in a manner similar to that described with reference to FIG. 3, via filter units PAa, PAb, PAc, to a signal-mixing unit ABU for forming a sum signal S=v1+v2+v3. If only signals originating from the sensors 6a, 6b are supplied to the signal-mixing unit, the test object will comprise the switchgear cubicle 171 and the output line 173 with equipment connected thereto. If signals originating from the sensors 6a, 6b and 6c are supplied to the signal-mixing unit, the test object is limited to comprising only the switchgear cubicle 171.

Figure 21:
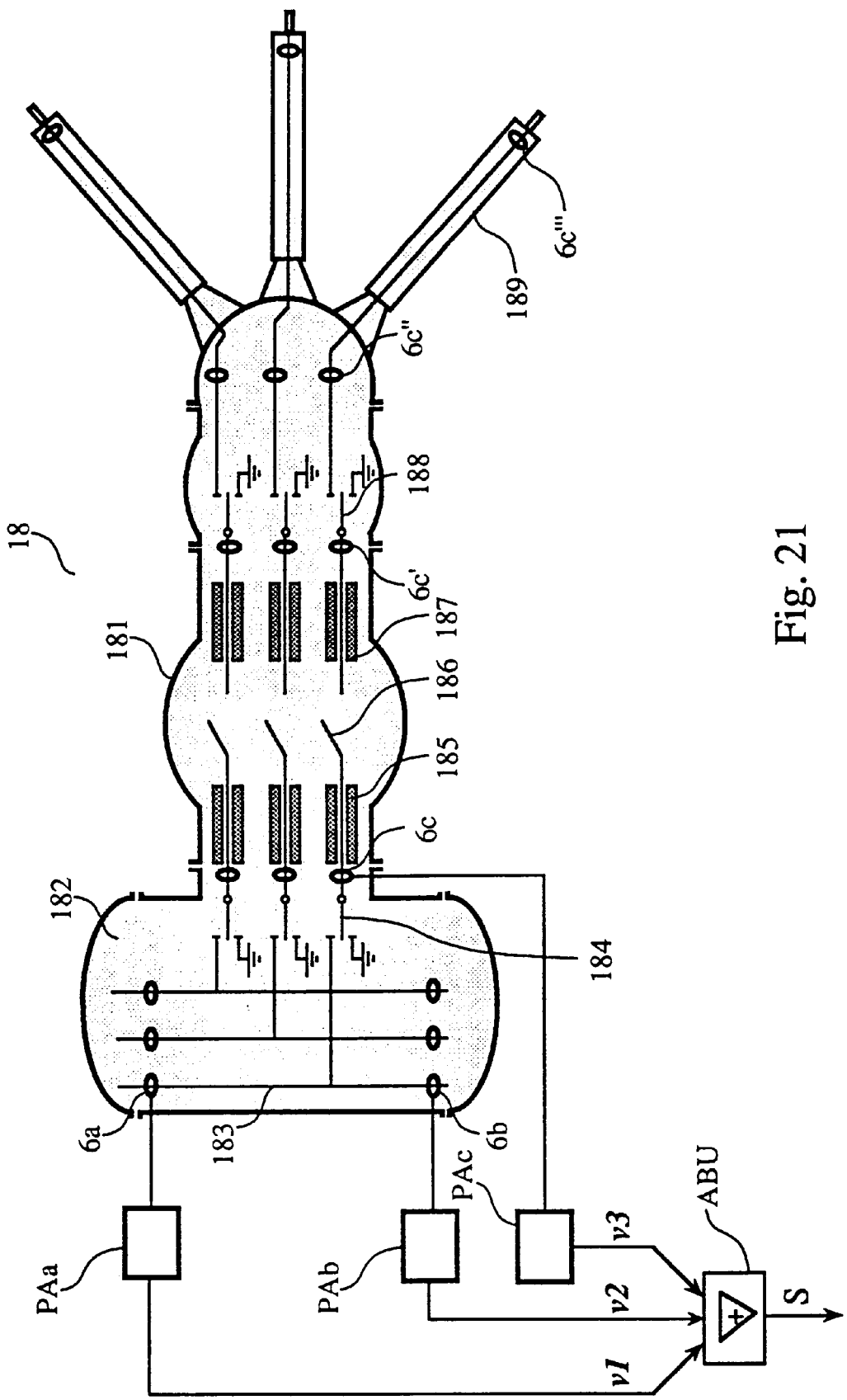
FIG. 21 shows embodiments of sensing equipment when the test object consists of a gas-insulated switchgear unit.

FIG. 21 shows an application of the invention where the test object is in the form of gas-insulated switchgear. The figure shows in the form of a single-line diagram a switchgear unit 18 with an enclosure 181, comprising an insulating gas 182, such as SF6. The switchgear unit is of three-phase design, but in the figure only one phase is marked with reference numerals, it being understood that all the phases are identical. The switchgear unit comprises a busbar 183, a grounding disconnector 184, a bushing 185, a circuit breaker 186, an additional bushing 187, an additional grounding disconnector 188 and an outdoor bushing 189. Sensors 6a, 6b, 6c, 6c', 6c", 6c''', exemplified in the figure by Rogowski coils, are arranged respectively around the busbar on both sides of the connection to the grounding disconnector 184, around the connection between the grounding disconnector 184 and the bushing 185, around the connection between the bushing 187 and the grounding disconnector 188, around the connection between the grounding disconnector 188 and the lower part of the outdoor bushing 189, and around the conductor through the outdoor bushing 189 at the upper part thereof. As an example it is shown how sensors signals originating from the sensors 6a, 6b, 6c, via filter units PAa, PAb, PAc are supplied to the signal-mixing unit ABU for forming a sum signal S=v1+v2+v3. The test object comprises in this case of the grounding disconnector 184 and parts of the busbar located between the sensors and the connection of the grounding disconnector thereto. It is realized from the foregoing and from FIG. 21 that by supplying to the signal-mixing unit signals originating from suitably chosen sensors, the test object can be limited to comprising a chosen part of the switchgear unit. By, for example, designing the signal-mixing unit as described with reference to FIG. 3 and supplying it with signals originating from the sensors 6c" and 6c''', a discharge can be located with high reliability at the outdoor bushing 189. Of course, all the phases in the switchgear may be equipped with sensors arranged in the manner described above.

FIGS. 24A–24B show an application of the invention where the test object is in the form of a current transformer.

FIG. 24A shows a single-phase current transformer 19 comprising a high-voltage bushing 191 and a box 192, both shown in cross section. A conductor 193, carrying the current to be measured, is passed down through the high-voltage bushing, through a core 194 arranged in the box, and again up through the high-voltage bushing. Around the core 194 also a secondary winding 195 is arranged. The core and the secondary winding are connected to ground potential by means of a conductor 196 and a measured value of the current through the conductor 193 is forwarded via a conductor 197. In this case, it is advantageous, as marked in the figure, to arrange a sensor 6a, exemplified in the figure by a Rogowski coil, around the lower part of the high-voltage bushing near the box. A discharge in those parts of the current transformer which are located in the box gives rise to current pulses which, viewed from the sensor, pass through the downwardly- and upwardly-extending parts of the conductor 193 in the same direction, whereas a discharge outside of these parts of the current transformer gives rise to current pulses which when viewed from the sensor, passes through the downwardly- and upwardly-extending parts of the conductor 193 in different directions. The magnetic field generated by the current pulses are therefore in the former case different from zero, whereas in the latter case it is essentially zero. In this case, thus, the test object comprises of those parts of the current transformer which are located in the box.

FIG. 24B shows a single-phase current transformer 19 of a so-called top-core model, comprising a high-voltage bushing 191 and a box 192, both shown in cross section. A toroidal core 194, which is connected to ground potential in a manner not shown in the figure, is arranged at the upper part of the high-voltage bushing. A conductor 193, carrying the current to be measured, is passed through the toroidal core. A secondary winding 195 is wound around the core and is brought with both its terminals 196, 197 through the high-voltage bushing to the box. The terminal 196 is connected to ground potential, and a measured value of the current through the conductor 193 is forwarded via a conductor 197. Also in this case, it is advantageous, as marked in the figure, to arrange a sensor 6a, exemplified in the figure by a Rogowski coil, around the lower part of the high-voltage bushing near the box. Discharges in those parts of the current transformer which are located above the sensor give rise to current pulses which, viewed from the sensor, pass through the downwardly- and upwardly-extending parts 196 and 197, respectively, of the conductor 195 in the same direction, whereas discharges outside of these parts of the current transformer give rise to current pulses which, viewed from the sensor, pass through the downwardly- and upwardly-extending parts of the conductor 195 in different directions. In the former case, therefore, the magnetic field generated by the current pulses becomes different from zero, whereas in the latter case it becomes essentially zero. In this case, thus, the test object consists of those parts of the current transformer which are located above the sensor.

Figure 25:
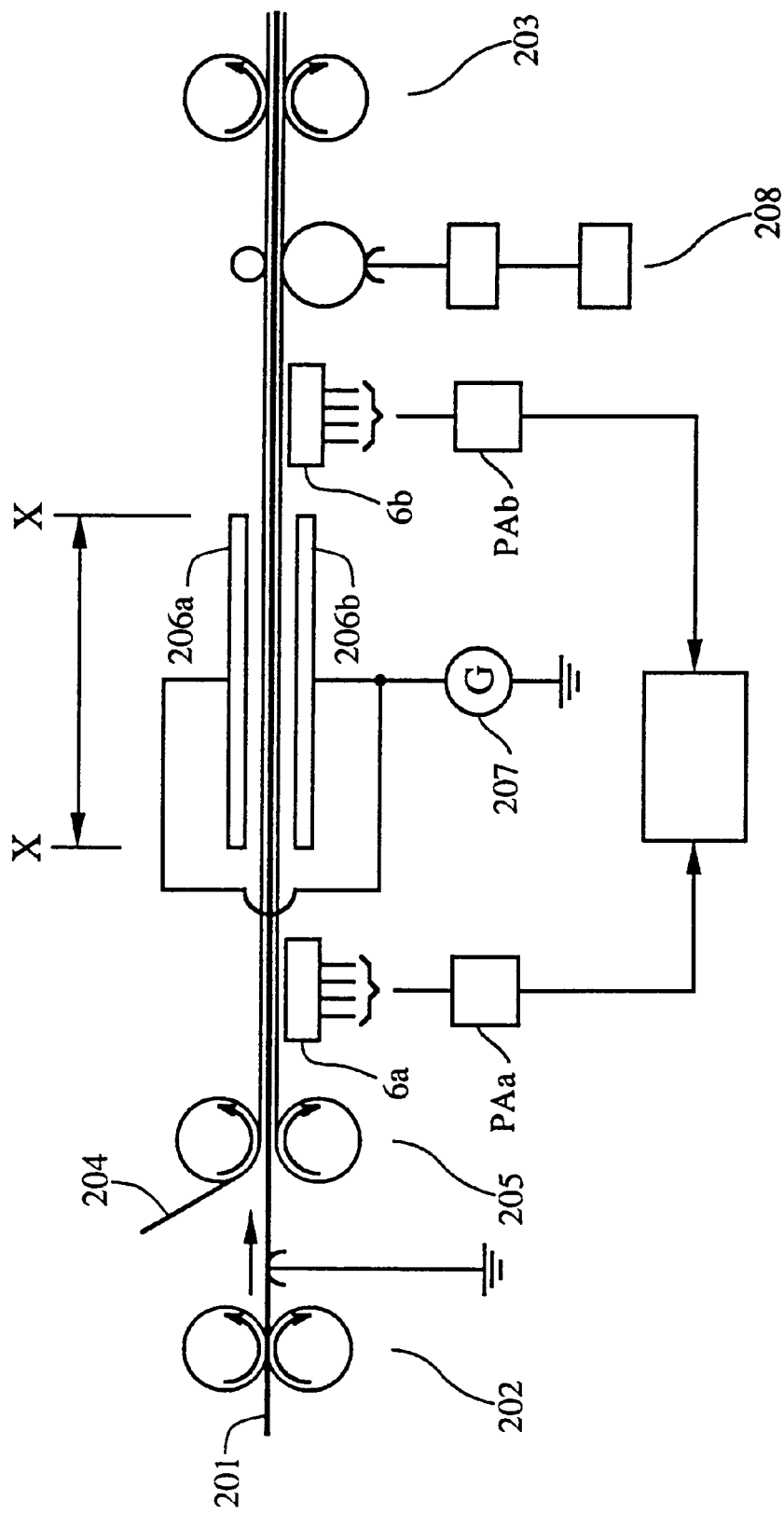
FIG. 25 shows an embodiment of sensing equipment when the test object consists of a movable path.

FIG. 25 shows an application of the invention when the test object is in the form of a continues web, for example an insulated electric conductor for a transformer winding which is under manufacture.

Conductors of the above kind are manufactured by casting a number of sub-conductors of copper in epoxy into a conductor in the form of a tape. To increase the insulating resistance of the conductor, a paper strip is wound around the tape so that the paper strip, viewed from a cross section through the conductor, becomes C-shaped. These steps in the manufacture take place while the conductor is fed forward in a continuous web, at a rate typically of the order of magnitude of 0.2 m/s, and it is thus advantageous to arrange a continuous inspection of the insulation of the conductor.

The figure shows a number of sub-conductors 201 which are fed forward between two roll pairs 202 and 203 in a direction of movement, marked by arrows, from left to right in the figure. A paper web 204 is supplied and folded around the sub-conductors in a rotating feed device 205. Two mutually galvanically connected electrodes 206a, 206b, which are elongated in the direction of movement of the web and which cover the entire width of the web, are arranged between the roll pairs 202 and 203. The electrode pair is fed with a high alternating voltage from a generator 207 and thus generates, in a section X—X of the web, an electric field perpendicular to the longitudinal direction of the web. Sensors 6a, 6b are arranged at the web, one at either end of the section X—X, and sensor signals v1", v2" are supplied via filter units PAa, PAb to a signal-mixing unit ABU. In this case, thus, the test object consists of the section X—X of the continuous web and the connection conductors of the test object of those two parts of the web which are connected to this section at the respective ends of the section. A device 208, only roughly indicated in the figure, comprises two metal brushes in electrical contact with the web. The brushes are connected to a voltage source and a current-sensing member senses if an electric current flows through the brushes, which indicates the absence of insulation.

Figure 22A:
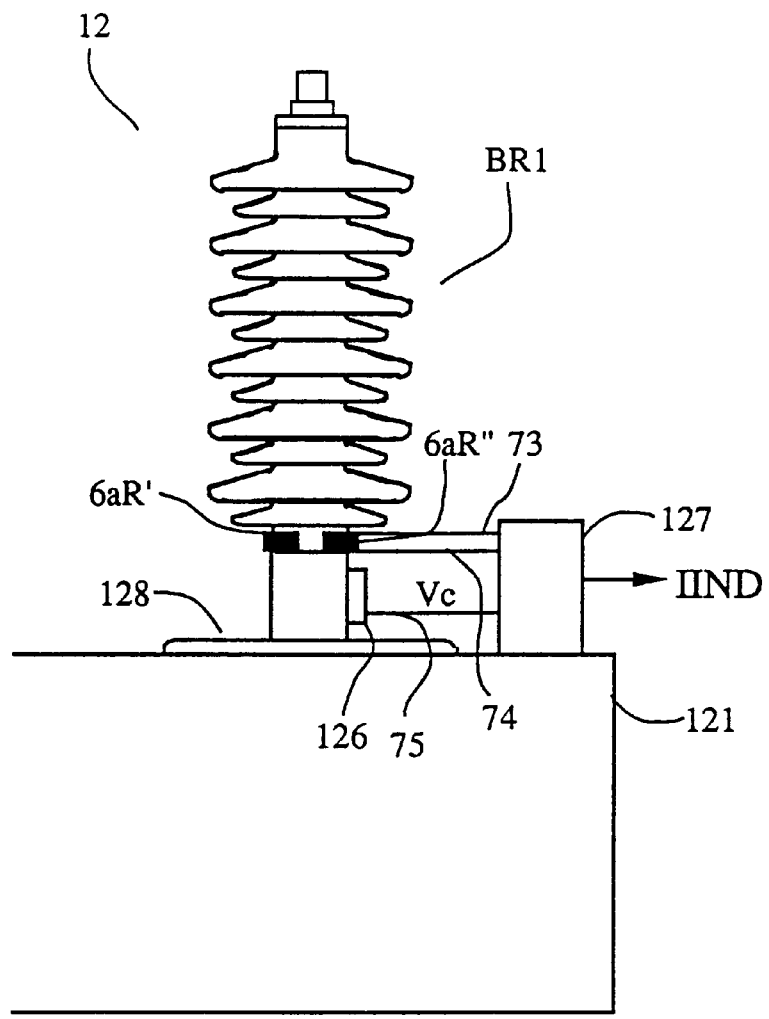
FIGS. 22A–22B show a further embodiment of sensing equipment when the test object consists of a power transformer.
Figure 22B:
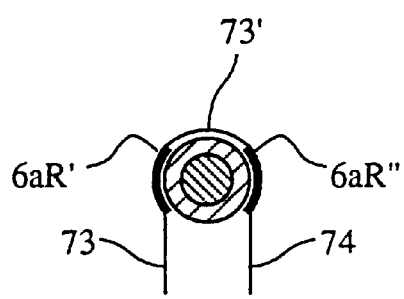

FIGS. 22A–22B show an improvement embodiment of the invention, which is especially advantageous for monitoring during normal operation in those cases where the test object exhibits a very high impedance, for example consists of a power transformer, and in particular in a difficult noise environment. The high impedance of the test object results in a current pulse, caused by an electric discharge outside of this, being greatly damped during its passage through the test object, and therefore a sensing via the magnetic field, associated with the current pulse, at the connection conductor where it flows out from the test object can be rendered considerably difficult.

FIG. 22A shows a part of a power transformer 12 with a box 121 and a high-voltage bushing BR1. A capacitive measurement terminal 126, arranged in a known manner, is provided at the high-voltage bushing. Around the lower part of the high-voltage bushing, just above a flange 128, through which the bushing passes into the transformer, a sensor 6aR is arranged, comprising two Rogowski coils 6aR', 6aR", mutually series-connected by means of a conductor 73' (FIG. 22B), each one being designed, for example, as described with reference to FIGS. 7A–7C.

FIG. 22B shows the sensor viewed from a plane perpendicular to the longitudinal axis of the bushing and illustrates that each one of the Rogowski coils comprises less than half the circumference of the bushing. The coils can be fixed to the bushing, for example by gluing, and the design of this transducer facilitates above all its mounting on bushings of various dimensions. From the interference point of view, it is advantageous to place the coils so as to be rotationally symmetrical around the bushing. The output signal v1 from the sensor is supplied via conductors 73, 74 to evaluation equipment 127. The output signal Vc from the capacitive measurement terminal is likewise supplied to the evaluation equipment via a conductor 75.

In this improvement of the invention, both the magnetic and the electric field, which are generated by a current pulse associated with a electric discharge in the test object, are sensed. By means of multiplication of signals caused by these fields, the power flux through a connection conductor which is associated with the discharge can be determined in magnitude and direction. The electric discharge may have either a positive or a negative polarity, by which is meant that the current pulses through the connection conductors of the test object associated with the discharge are either directed in a direction towards the test object of away from this. This polarity is determined by sensing the polarity of the output signal Vc from the capacitive measurement terminal whereas the direction of the current pulses is determined by sensing the polarity of the output signal v1 from the transducer 6aR.

Figure 23:
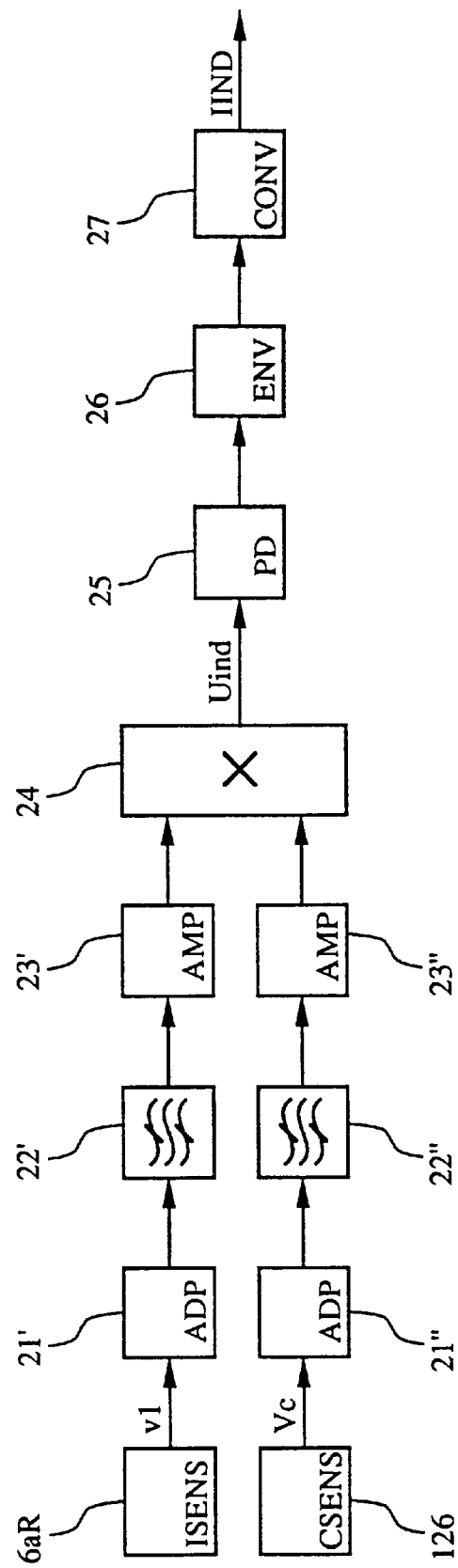
FIG. 23 shows an embodiment of evaluation equipment in sensing equipment according to FIGS. 22A–22B, FIGS. 24A–24B show embodiments of sensing equipment when the test object consists of a current transformer.

An embodiment of the evaluation equipment 127 is shown in FIG. 23. The output signal v1 from the sensor 6aR and the output signal Vc from the capacitive measurement terminal are each supplied to a respective interface unit 21', 21", respectively, in order to be adapted to each other and to a suitable signal level, in a known manner, by means of resistive, capacitive, inductive and amplifying circuit elements. The output signals from the respective interface units are each supplied to a respective bandpass filter 22', 22". The bandpass filter 22', associated with the output signal from the transducer 6aR, has its passband around the natural resonance frequency of the sensor, which in turn is selected to obtain the best signal/noise ratio in the measurement system. The passband for the bandpass filter 22" may suitably be given the same characteristic as the bandpass filter 22'.

The output signals from the respective bandpass filter are each supplied for level adaptation to an amplification member 23', 23", respectively, and the output signals from these are supplied to a multiplying member 24, in which the two signals are multiplied by each other. The output signal from the multiplier is now either positive or negative, depending on the origin of the discharge. In this embodiment, it is assumed that a positive output signal indicates a discharge in the test object, which can be achieved by selection of the winding direction for the coils comprised in the sensor 6aR.

The output signal Uind from the multiplying member is supplied to a peak value detector 25, which to an envelope circuit 26 only forwards signals with a positive polarity. The envelope circuit reproduces its input signal with an extended decay time. The amplitude of the output signal from the envelope circuit is related to the level of the sensed discharges in the test object such that an increasing level of internal discharge results in an increasing value of the output signal of the envelope circuit. The output signal thereof is supplied to a signal-converting member 27, which converts the output signal from the envelope circuit to a corresponding direct current IIND. The amplitude of this direct-current signal is dependent on the amplitude of the input signal to the signal-converting member and thus dependent on the magnitude of the discharge. The signal IIND is forwarded to monitoring equipment (not shown in the figure) to be compared in a known manner with a chosen alarm level.

It may be noted that, in this improvement of the invention, an indicating signal for indicating the presence of a discharge in the test object is obtained with a sensor signal for sensing the magnetic field, associated with the current pulse, at only one of the connection conductors of the test object. In the event that no capacitive measurement terminal exists at the bushing of the transformer, some other type of sensor for sensing the electric field generated by the current pulse may be used.

Figure 26:
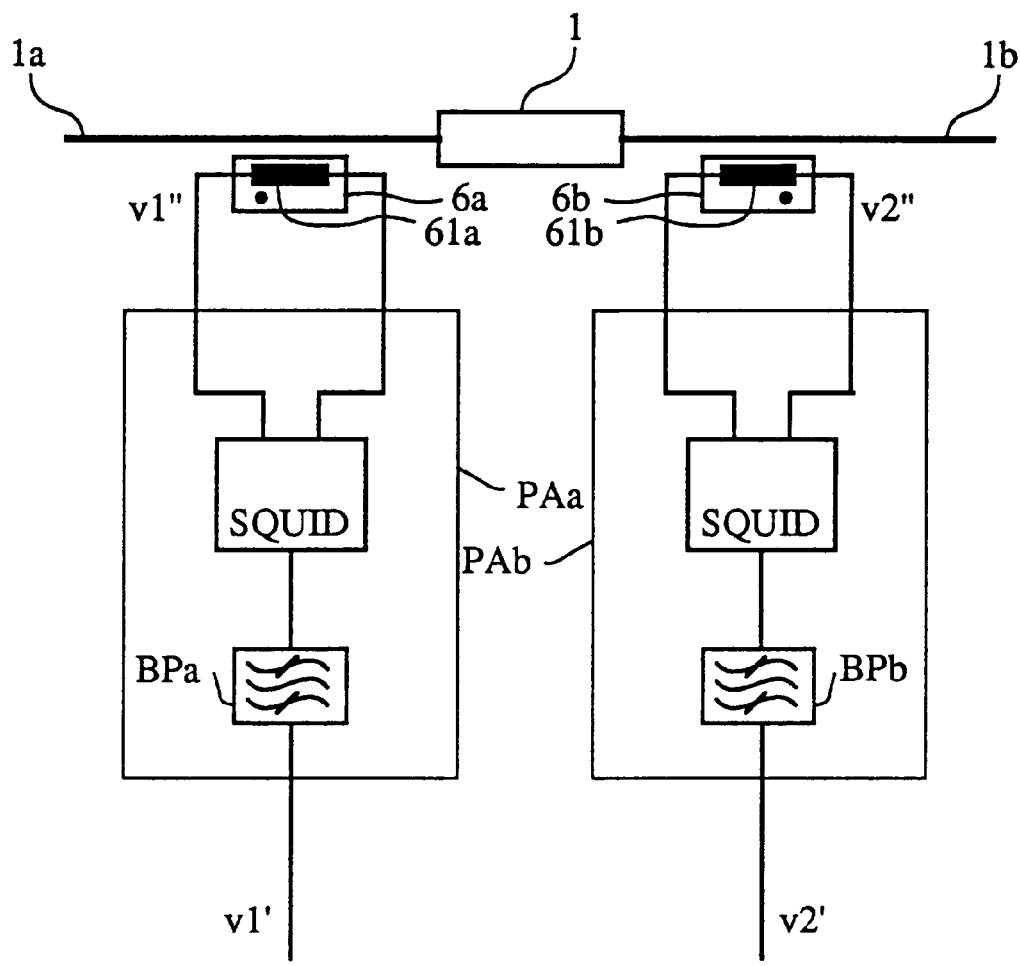
FIG. 26 shows an embodiment of sensing equipment comprising a superconducting sensor.

Still another advantageous embodiment of sensor equipment is shown in FIG. 26. Two sensor 6a, 6b, respectively, in the form of Rogowski coils 61a, 61b, respectively, are arranged one on each side of a test object 1. Each one of the Rogowski coils is connected to a superconducting sensor of a kind known, a so-called SQUID. The output signals from the respective superconducting sensor are supplied to bandpass filters BPa, BPb to form signals v1' and v2', which can then be processed further, for example as described above with reference to FIG. 3A.

Figure 27:
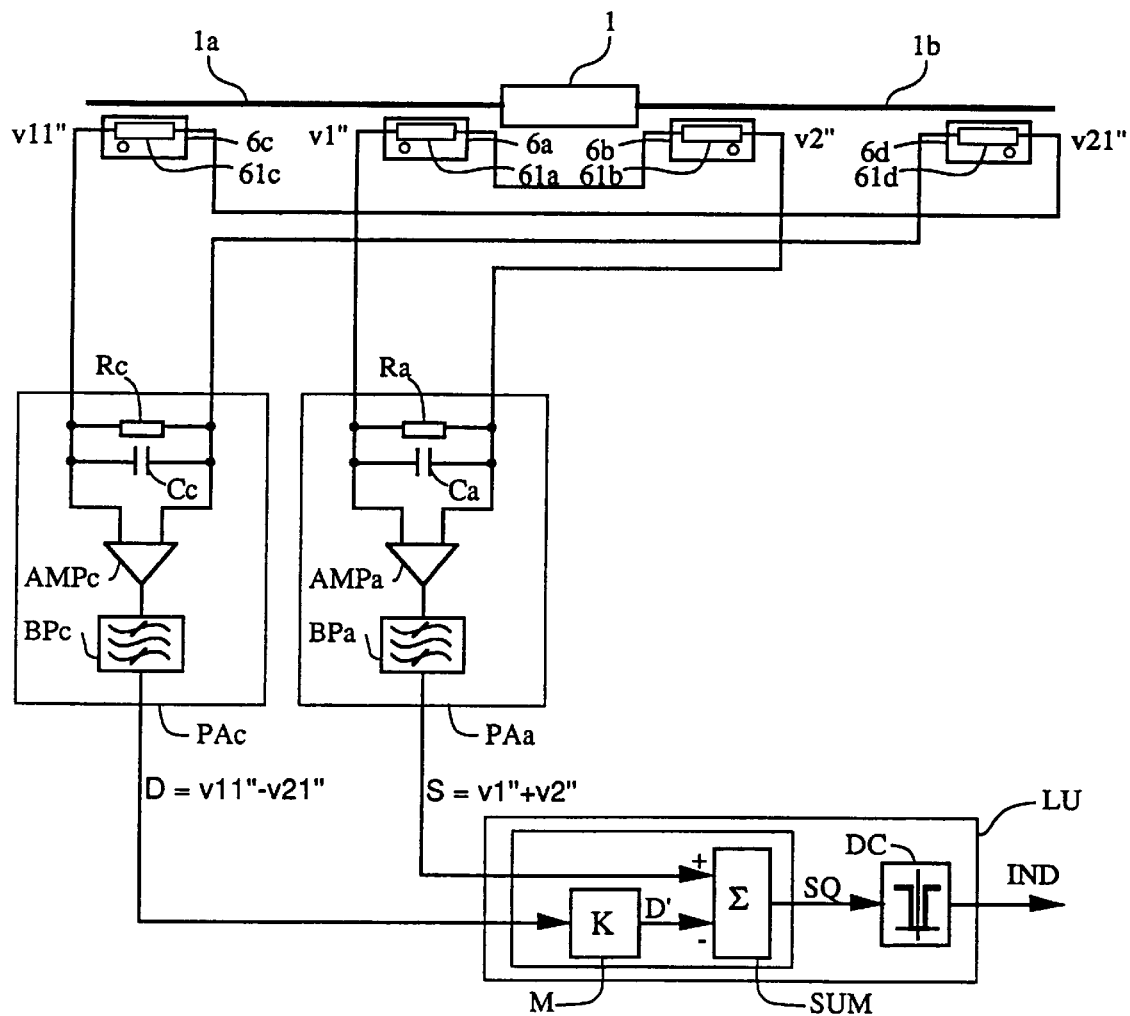
FIG. 27 shows an embodiment of sensing equipment comprising series-connected Rogowski coils.

FIG. 27 shows an alternative embodiment of sensor equipment. Four sensors 6a, 6c and 6b, 6d, respectively, in the form of Rogowski coils, are arranged two-by-two on each side of a test object 1 at the connection conductors 1a and 1b, respectively, thereof. Coils arranged on both sides of the test object are series-connected to each other such that the coils 6a and 6b are wound in opposite directions to each other and the coils 6c and 6d are wound in the same direction with respect to each other. The output signal from the series connection of the negative-feedback coils is supplied to a filter unit PAa and the output signal from the series connection of the positive-feedback coils is supplied to a filter unit PAc, which filter units are of the same kind as those described with reference to FIG. 1. It is realized that, by the connection of the coils, the amplifiers, in FIG. 27 designated AMPa and AMPc, respectively, comprised in the filter units will form signals corresponding to the sum and difference signals S and D described with reference to FIG. 4. These signals are supplied to a comparing member Q, for example of the same kind as that described with reference to FIG. 3B.

The invention is not limited to the embodiments shown but the inventive concept also comprises other combinations of the transducers described, of the principles of signal mixing and of measurement objects.

The invention is based on the use of sensors which can be manufactured in shapes and dimensions adapted to test objects of varying kinds and which are galvanically separated therefrom. The evaluation equipment for locating the discharge at the test object is based on simple and reliable principles and is therefore insensitive to external interference.

What is claimed is:

1. A device for sensing electric discharges in a current transformer arranged at a current-carrying conductor, the transformer having a secondary winding and a high-voltage bushing, in which bushing downwardly and upwardly extending parts of either of the current-carrying conductor and the secondary winding are arranged, the device comprising evaluation equipment and a Rogowski coil for delivery of a sensor signal to said evaluation equipment, wherein said Rogowski coil surrounds the downwardly and upwardly extending parts of either of the current-carrying conductor and the secondary winding, and said evaluation equipment in dependence on received sensor signals generates an indicating signal, indicating an electric discharge in the current transformer when the Rogowski coil senses current pulses which essentially simultaneously flow in the downwardly and upwardly extending parts of either of the current-carrying conductor and the secondary winding, either in a direction out of the current transformer or in a direction into the current transformer.

2. A device for sensing electric discharges in a test object with at least two electric connection conductors, the device comprising sensing equipment and an evaluation equipment, the sensing equipment having at least two sensors for direction-sensitive sensing of current pulses through the connection conductors by sensing a magnetic field generated by the current pulses and the polarity thereof, each of the sensors delivering a sensor signal to the evaluation equipment in dependence on the current pulses and their direction, the evaluation equipment generating an indicating signal, based on the received sensor signals, indicating an electric discharge in the test object when the sensing equipment senses current pulses which essentially simultaneously flow either in a direction out of the test object through all the connection conductors or in a direction into the test object through all the connection conductors, the evaluating equipment comprising means for forming a sum signal in dependence on a sum of sensor signals originating from sensors associated with mutually different connection conductors, means for forming a difference signal in dependence on a difference of sensor signals originating from sensors associated with mutually different connection conductors, and a comparing member for forming a comparison signal based on said sum signal and said difference signal and wherein the evaluation equipment forms the indicating signal based on said comparison signal.

3. A device according to claim 2, wherein two sensors are provided for each of the at least two connection conductors, for sensing current pulses through the respective connection conductor.

4. A device according to claim 2, wherein said difference signal is formed in dependence on sensor signals originating from the same sensors that deliver sensor signals from which said sum signal is formed.

5. A device according to claim 2, wherein the evaluation equipment further comprises a band pass filter; and an associated filter unit for each sensor, said filter having a tuning circuit for tuning the natural frequency of the sensor, and wherein the sensor signals are supplied to said filter unit, and said sum and difference signals being formed in dependence on output signals from said filter unit.

6. A device according to claim 5, wherein said bandpass filters are tuned to a series resonance frequency of the test object.

7. A device according to claim 2, wherein the evaluation equipment further comprises weighting members for weighting the signals from which said sum signal is formed.

8. A device according to claim 2, wherein the evaluation equipment further comprises model elements selected and arranged to have characteristics similar to the test object and which damps and/or phase-shifts the signals from which said sum signal is formed to duplicate the amplitude damping and/or phase shift undergone by said current pulse flowing through the connection conductors of the test object.

9. A device according to claim 2, wherein the test object includes a section of a continuous web, and the connection conductors are the parts of the web which are connected to said section, the device further comprising at least two electrodes energized by alternating voltage and extended in the direction of movement of the web, and each of said electrodes arranged on a respective side of the web to cover said section of the web, and the sensor equipment having at least one sensor arranged at each of the connection conductors.

10. A device according to claim 2, wherein the test object is a switchgear cubicle in an electric switchgear unit with a busbar and an output line, and wherein the sensing equipment has sensors arranged at the busbar on both sides of the switchgear cubicle.

11. A device according to claim 10, wherein the sensing equipment has sensors arranged at said output line as viewed from the switchgear cubicle.

12. A device according to claim 2, wherein the test object is a plurality of mutually series-connected coils in a phase of a stator winding for an electric ac generator, wherein the sensing equipment has one of said sensors arranged at a terminal of each of said coils and wherein the means for forming sum signals forms said sum signals in dependence on a sum of sensor signals originating from an arbitrarily chosen pair of said sensors.

13. A device according to claim 12, wherein the means for forming sum signals comprises adding members for forming said sum signals in dependence on sensor signals originating from a pair of sensors arranged at terminals of said coils which are arranged adjacent each other in the mutual series connection.

14. A device according to claim 2, wherein the sensor comprises at least one Rogowski coil arranged around one of said connection conductors.

15. A device according to claim 14, wherein said Rogowski coil is arranged around a U-shaped core of magnetic material, which core is arranged around one of said connection conductors.

16. A device according to claim 2, wherein the test object is a coil in a stator winding for an electric generator, said coil and an additional coil of the stator winding being disposed in one winding slot in the stator of the generator, and wherein the sensor comprises a series connection of two Rogowski coils wound in opposite directions and arranged around a common U-shaped core of magnetic material, such that one of said Rogowski coils is arranged at that coil which constitutes the test object and the other of said Rogowski coils is arranged at said additional coil in said winding slot of the stator winding.

17. A device according to claim 2, wherein the test object consists of a coil in a stator winding for an electric generator, said coil and an additional coil of the stator winding being disposed in one winding slot in the stator of the generator, and wherein the sensor comprises a substantially flat Rogowski coil arranged in said winding slot in the stator and between said coil and said additional coil.

18. A device according to claim 2, wherein the test object has an elongated extension and wherein the sensor equipment comprises at least one Rogowski coil arranged movable along the test object.

19. A device according to claim 2, wherein the test object is a power transformer with at least one high-voltage bushing and a capacitive measurement terminal arranged at said bushing, and wherein the sensor comprises at least one Rogowski coil arranged around said high-voltage bushing and that the evaluation equipment is supplied with a measurement signal from said capacitive measurement terminal.

20. A device according to claim 19, wherein the sensor comprises two separate mutually series-connected Rogowski coils, arranged opposite to each other around said high-voltage bushing.

21. A device according to claim 2, wherein the sensors comprise at least one Rogowski coil arranged at each said connection conductor, and a superconductor sensor connected to said Rogowski coil.

* * * * *